(12) United States Patent
Atanackovic

(10) Patent No.: US 7,384,481 B2
(45) Date of Patent: Jun. 10, 2008

(54) METHOD OF FORMING A RARE-EARTH DIELECTRIC LAYER

(75) Inventor: Petar Atanackovic, Palo Alto, CA (US)

(73) Assignee: Translucent Photonics, Inc., Palo Alto, CA (US)

( * ) Notice: Subject to any disclaimer, the term of this patent is extended or adjusted under 35 U.S.C. 154(b) by 148 days.

(21) Appl. No.: 11/254,031

(22) Filed: Oct. 19, 2005

(65) Prior Publication Data

US 2006/0060131 A1    Mar. 23, 2006

Related U.S. Application Data

(63) Continuation-in-part of application No. 11/025,693, filed on Dec. 28, 2004.

(60) Provisional application No. 60/533,378, filed on Dec. 29, 2003.

(51) Int. Cl.
*C30B 25/00* (2006.01)
*C30B 28/12* (2006.01)
*C30B 28/14* (2006.01)
*C30B 23/00* (2006.01)

(52) U.S. Cl. .......................... 117/945; 117/84; 117/98; 117/99; 117/101; 117/103; 117/104; 117/105; 117/944; 117/947; 438/478; 438/763

(58) Field of Classification Search ................. 117/43, 117/84, 98, 99, 101, 103, 104, 105, 944, 947; 257/310, 410, 64; 427/226, 225; 438/478, 438/763
See application file for complete search history.

(56) References Cited

U.S. PATENT DOCUMENTS

| | | | |
|---|---|---|---|
| 4,195,908 A * | 4/1980 | Kestigian et al. ............ 359/484 |
| 4,795,968 A * | 1/1989 | Madou et al. ................. 422/88 |
| 4,864,462 A * | 9/1989 | Madou et al. ............... 361/280 |
| 5,084,438 A * | 1/1992 | Matsubara et al. .......... 505/235 |
| 5,166,094 A * | 11/1992 | Kapoor ......................... 438/328 |
| 5,323,053 A * | 6/1994 | Luryi et al. .................. 257/485 |
| 5,523,069 A * | 6/1996 | Lin ........................... 423/242.7 |
| 5,523,587 A * | 6/1996 | Kwo ............................. 257/64 |
| 5,679,624 A * | 10/1997 | Das ............................. 505/210 |
| 5,962,069 A * | 10/1999 | Schindler et al. ............... 438/3 |
| 6,501,121 B1 * | 12/2002 | Yu et al. ...................... 257/310 |
| 6,518,609 B1 * | 2/2003 | Ramesh ....................... 257/295 |
| 6,518,634 B1 | 2/2003 | Nguyen et al. |
| 6,528,377 B1 | 3/2003 | Mihopoulos et al. |
| 6,534,348 B1 * | 3/2003 | Moise et al. ................. 438/158 |
| 6,555,886 B1 * | 4/2003 | Xu et al. ..................... 257/410 |
| 6,610,548 B1 | 8/2003 | Ami et al. |
| 6,638,872 B1 | 10/2003 | Croswell et al. |
| 6,642,539 B2 * | 11/2003 | Ramesh et al. ............... 257/43 |
| 6,709,989 B2 * | 3/2004 | Ramdani et al. ............. 438/763 |
| 6,764,927 B1 * | 7/2004 | Yao et al. .................... 438/478 |

(Continued)

FOREIGN PATENT DOCUMENTS

JP    10107216 A  *  4/1998

*Primary Examiner*—Yogendra N. Gupta
*Assistant Examiner*—Seyed Masoud Malekzadeh
(74) *Attorney, Agent, or Firm*—DeMont & Breyer LLC

(57) ABSTRACT

Methods for forming compositions comprising a single-phase rare-earth dielectric disposed on a substrate are disclosed. In some embodiments, the method forms a semiconductor-on-insulator structure. Compositions and structures that are formed via the method provide the basis for forming high-performance devices and circuits.

38 Claims, 16 Drawing Sheets

U.S. PATENT DOCUMENTS

| | | | |
|---|---|---|---|
| 6,781,176 B2* | 8/2004 | Ramesh | 257/295 |
| 6,933,219 B1* | 8/2005 | Lingunis et al. | 438/593 |
| 7,129,551 B2* | 10/2006 | Osten | 257/410 |
| 7,196,382 B2* | 3/2007 | Krüger, deceased et al. | 257/382 |
| 2002/0197881 A1* | 12/2002 | Ramdani et al. | 438/764 |
| 2003/0062553 A1* | 4/2003 | Ramesh et al. | 257/295 |
| 2003/0071327 A1* | 4/2003 | Ooms et al. | 257/532 |
| 2003/0127674 A1* | 7/2003 | Ramesh | 257/295 |
| 2003/0183885 A1* | 10/2003 | Nishikawa et al. | 257/410 |
| 2003/0193061 A1* | 10/2003 | Osten | 257/288 |
| 2004/0029321 A1* | 2/2004 | Ang et al. | 438/142 |
| 2005/0227466 A1* | 10/2005 | Kruger et al. | 438/583 |
| 2006/0065930 A1 | 3/2006 | Kelman | |

* cited by examiner

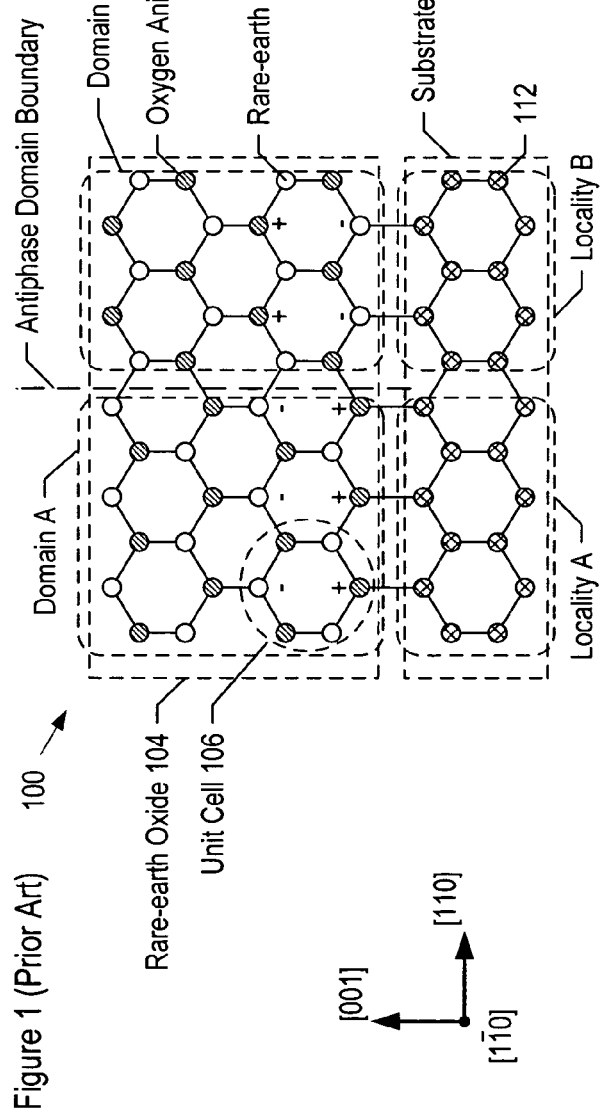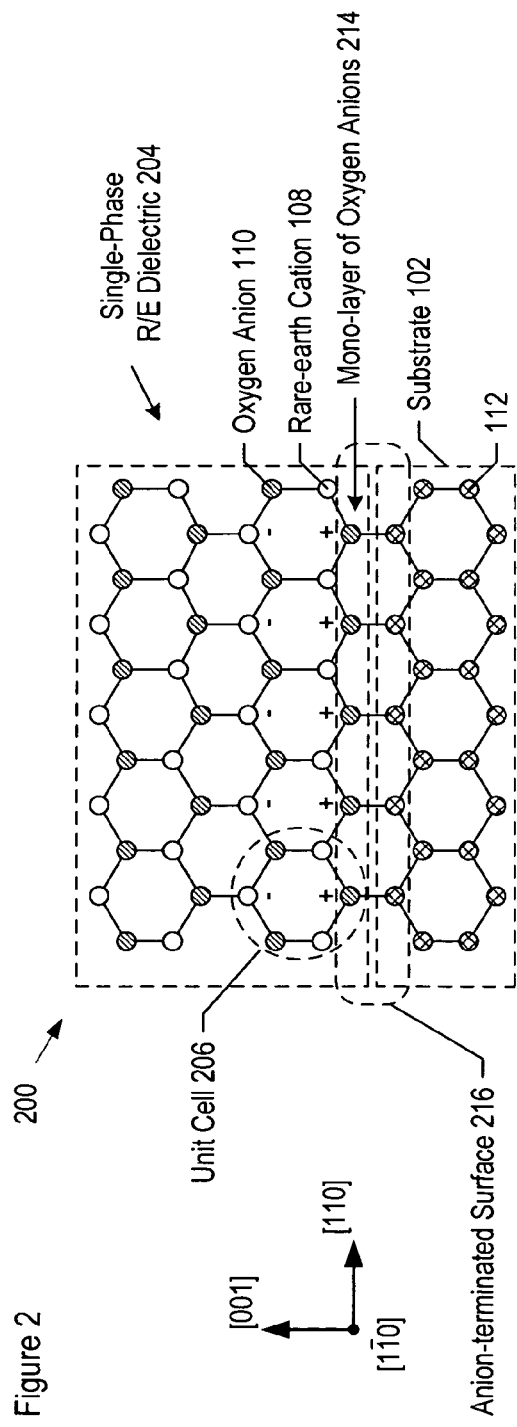
Figure 1 (Prior Art)
Figure 2

METHOD OF FORMING A RARE-EARTH DIELECTRIC LAYER

STATEMENT OF RELATED CASES

This application is a continuation-in-part of co-pending U.S. patent application Ser. No. 11/025,693 filed on Dec. 28, 2004, which claims priority of provisional patent application U.S. Ser. No. 60/533,378 filed on Dec. 29, 2003. Furthermore, this case is related to U.S. patent application Ser. No. 11/253,525, filed on even date herewith, and incorporated by reference herein.

FIELD OF THE INVENTION

The present invention relates to compositions for electronic devices and integrated circuits.

BACKGROUND OF THE INVENTION

Silicon is the material of choice for the fabrication of ultra large scale integrated ("ULSI") circuits. This is due, in large part, to the fact that silicon is the only semiconductor substrate material that can be formed as large-diameter wafers with sufficiently low defect density. Also, silicon forms a high-quality oxide (i.e., silicon dioxide), and the quality of the silicon/silicon dioxide interface is also quite high.

It is notable that germanium, while otherwise very desirable as a material for the fabrication of integrated circuits, has not achieved commercial acceptance. This is due to its high cost and low availability, which is a direct consequence of the defect-related low-yield of germanium substrates.

But the baton might soon be passed from the silicon/silicon dioxide material system to other materials in order to satisfy industry requirements for continued advancements in the performance of integrated circuits and the removal of roadblocks to the continuation of Moore's Law.

More specifically, as node-scaling of ULSI circuits is pushed further into the sub-micron regime, silicon dioxide becomes increasingly less attractive as an interlayer dielectric material (e.g., gate oxide, etc.). In particular, as silicon-based interlayer dielectrics become extremely thin, fundamental problems arise, such as an increase in quantum mechanical tunneling current, a decrease in dielectric breakdown strength, and a decrease in reliability. Furthermore, decreases in the thickness of silicon-based interlayer dielectrics in ULSI electronics will result in increases in capacitance, which cause concomitant increases in RC (interconnect) delays and cross talk. This adversely impacts device speed and power dissipation.

A further issue with the silicon/silicon dioxide material system is that in conventional integrated-circuit processing, a rate-limiting and yield-limiting step is the production of a gate oxide of sufficient quality. In order to produce a high-quality gate oxide, the semiconductor surface is subjected to high temperatures while under vacuum to desorb any native oxide that has formed during prior wafer processing. Once this native oxide is desorbed, a new gate oxide is formed on the newly-cleared surface. As ULSI technology continues to scale further into the sub-micron regime, it will become increasingly difficult and expensive to obtain gate oxides of the requisite quality.

In order to address these problems, the semiconductor industry has undertaken a search for alternative materials for use as an interlayer dielectric. Suitable alternative materials should exhibit:

i. a dielectric constant (K) higher than that of silicon dioxide;
  ii. large conduction and valence band offsets with silicon;
  iii. thermal stability and reliability;
  iv. high-quality dielectric/semiconductor interface;
  v. low impurity concentration; and
  vi. manufacturability.

Single-crystal rare-earth dielectrics are an attractive choice for high-K dielectric materials. Unfortunately, these materials do not naturally occur, nor can they be produced using prior-art growth techniques. On the other hand, amorphous, polycrystalline, or multi-domain crystalline rare-earth oxides are possible to produce. But these rare-earth oxides are ill-suited for high-performance integrated circuits since they do not exhibit some of the characteristics listed above. In addition, the thickness to which many prior-art rare-earth dielectrics can be grown on silicon is limited.

Prior art rare-earth dielectric deposition techniques have been unsuccessful in controlling the stoichiometry and crystalline structure for realization of single domain, single crystal rare-earth dielectrics. The inherent limitation of most prior art techniques is a lack of elemental control during deposition. These rare-earth dielectric deposition techniques typically involve the evaporation of constituent rare-earth oxide powders to deposit evaporant on the substrate. Due to the very high melting point of these oxides, coupled with a very low vapor pressure, e-beam evaporation has been the most commonly used technique in the prior art.

Alkaline-oxide deposition techniques are limited to depositing alkaline-oxide layers of approximately 10 monolayers on silicon, due to crystal relaxation and defect formation. In addition, alkaline-oxides are characterized by a negligible conduction band offset relative to silicon. These alkaline-oxide films, therefore, provide insufficient utility as interlayer dielectric layers in high-performance silicon integrated circuits.

Continued scaling of ULSI into the sub-micron regime is also pushing the limits of the silicon substrate itself. It is widely expected that the future of ULSI will be based on semiconductor-on-insulator wafers that utilize fully-depleted field-effect transistors (FETs) formed in an ultrathin, active layer of silicon. Fully-depleted electronic devices become viable as the thickness of the active layer is reduced below 100 nanometers (nm).

Currently available methods to produce silicon-on-insulator ("SOI") wafers rely on wafer bonding of oxidized silicon wafers followed by removal of most of one of the two substrates to form the active layer. Although several variations of this technology exist, all are incapable of providing ultrathin active layers of sufficient quality for fully-depleted electronics. In addition, the interface quality and impurity concentration of the buried oxide layers is insufficient to support high-performance integrated circuitry. Finally, the complexity of wafer bonding processes used to produce SOI wafers is quite high, which leads to high costs. For these reasons, among any others, the acceptance of SOI wafers by the semiconductor industry has been rather limited.

SUMMARY OF THE INVENTION

The present invention provides a method for forming compositions that include one or more layers of one or more types of single-phase material. Single-phase morphology is characterized by a single-crystal, single-domain crystalline structure.

In some embodiments, the method provides a composition having a single-phase rare-earth dielectric disposed on a substrate. The dielectric is formed via an epitaxy process. In some other embodiments, the method is extended to form a semiconductor-on-insulator layer structure, wherein a single-phase semiconductor layer is grown on the single-phase rare-earth dielectric, preferably via an epitaxy process.

The semiconductor-on-insulator structure introduced above is analogous to, but different from, a typical SOI wafer. In particular, in some of the semiconductor-on-insulator structures that are disclosed herein, a single-phase rare-earth dielectric serves as the buried oxide layer and a single-phase semiconductor layer is the upper, active layer of silicon.

The ability to produce single-phase layers is a distinguishing feature of the methods disclosed herein. These single-phase materials result in high-quality dielectric/semiconductor interfaces, such as are required for high-performance devices and circuits. Furthermore, single-phase rare-earth dielectric layers, such as can be formed using the methods described herein, do not suffer from a limitation on thickness, as exhibited in the prior art.

BRIEF DESCRIPTION OF THE DRAWINGS

FIG. 1 depicts a crystal structure diagram of a prior-art composition comprising a rare-earth oxide disposed on a substrate.

FIG. 2 depicts a crystal structure diagram of a composition comprising a single-phase rare-earth dielectric material, in accordance with an embodiment of the present invention.

DETAILED DESCRIPTION

I. Definitions

Figure 3:
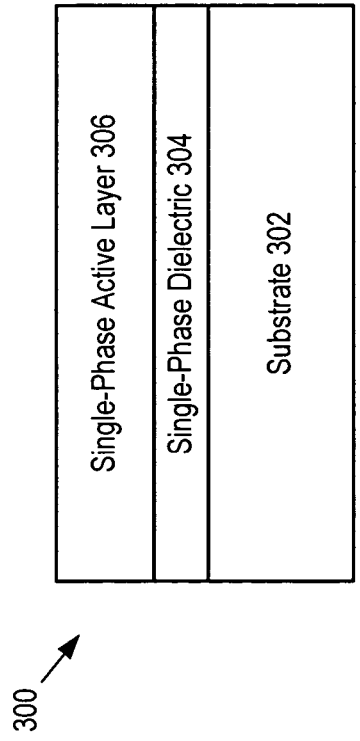
FIG. 3 depicts a semiconductor-on-insulator structure in accordance with the illustrative embodiment of the present invention.

The following terms are defined for use in this Specification, including the appended claims:

Layer means a substantially-uniform thickness of a material covering a surface. A layer can be either continuous or discontinuous (i.e., having gaps between regions of the material). For example, a layer can completely cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on or Formed on means "exists on" an underlying material or layer. This layer may comprise intermediate layers, such as transitional layers, necessary to ensure a suitable surface. For example, if a material is described to be "disposed (or grown) on a substrate," this can mean that either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, germanium, alumina, gallium-arsenide, indium-phosphide, silica, silicon dioxide, borosilicate glass, pyrex, and sapphire. Also, the term "substrate" can include additional transitional layers (e.g., layers that are used to promote the growth of subsequent layers, etc.) that are actually deposited on the surface of the "substrate" proper.

Mis-cut or Off-cut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20 degrees. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer. Several important distinctions betweens prior-art SOI wafers and the inventive semiconductor-on-insulator compositions are that:

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions in accordance with the invention include, without limitation: silicon-on-insulator, germanium-on-insulator, and silicon-germanium-on-insulator.

In some embodiments, the semiconductor-on-insulator compositions that are disclosed herein include additional layers between the semiconductor layer and the substrate.

II. Overview

The methods described herein enable the formation of material layers having a unique, single-phase morphology. As defined above, the phrase "single phase" means single crystal and single domain. To provide background for the description that follows, a discussion of two different oxide layer structures, one possessing single-phase morphology and one that does not, is now presented.

FIG. 1 depicts known composition 100, which includes a layer 104 of rare-earth oxide on a substrate 102. Layer 104 is NOT a single-phase layer. It is single-crystalline, but it is not single phase. More particularly, layer 104 exhibits multiple domains: Domain A and Domain B. These domains are each single-crystalline and have the same basic crystal structure, which is represented by unit cells 106. Since, however, layer 104 includes more than one domain, it cannot be single phase.

Each unit cell 106 of layer 104 of rare-earth oxide includes rare-earth cations 108 and oxygen anions 110. Unit cell 106 is polar. And the polarity of unit cells 106 in Domain A is opposite to the polarity of unit cells 106 in Domain B.

For this illustration, substrate 102 is a non-polar substrate (e.g., silicon, etc.) having a homogeneous distribution of atoms 112. As such, there is no energetically-favorable bonding site for either rare-earth cations 108 or oxygen anions 110 of unit cells 106. Therefore, crystal growth of rare-earth oxide layer 104 on substrate 102 can begin with the deposition of either cations or anions.

During the growth of rare-earth oxide layer 104, the growth of Domain A initiates on Locality A of substrate 102. At the same time, the growth of Domain B initiates on Locality B of substrate 102. Since the crystal structure initiates on the two regions of the non-polar substrate independently, and no energetically-favorable anion or cation bonding sites exist, nothing ensures that the orientation of unit cells 106 in Locality A and the orientation of unit cells 106 in Locality B are the same. In fact, in FIG. 1, unit cell 106 is oriented differently in Domain A and Domain B and an anti-phase domain boundary arises between them. The result is a multi-domain, single-crystal layer of rare-earth oxide.

The multi-domain nature of rare-earth oxide 104 leads to a net-charge defect density that is too high for use in high-performance integrated circuits that are formed in a semiconductor layer disposed on rare-earth oxide 104. In addition, the multi-domain nature of rare-earth oxide 104 leads to undesirable surface roughness and/or structural non-uniformity.

FIG. 2 depicts composition 200, which includes a layer 204 of rare-earth oxide on a substrate 102. Layer 204 exhibits single-phase morphology. In contrast to FIG. 1, the orientation and the polarity of unit cells 206 are uniform throughout layer 204. As described in more detail later in this specification, unit cells 106 exhibit one of several specific arrangements. The unit cells 106 in prior art composition 100 might or might not have the same arrangement as unit cells 204.

In the embodiment that is shown in FIG. 2, monolayer 214 of oxygen anions 110 is first deposited on the surface of substrate 102, thereby forming anion-terminated surface 216. Anion-terminated surface 216 provides energetically-favorable bonding sites for rare-earth cations 108, thus ensuring uniform orientation of unit cells 206.

This disclosure now turns to a description of the illustrative embodiment, which is a method for making a semiconductor-on-insulator structure.

III. Semiconductor-on-Insulator and Method Therefor

Single-phase dielectric-on-substrate composition 200, which is depicted in FIG. 2, forms the basis for a semiconductor-on-insulator structure. In order to form a semiconductor-on-insulator structure that is suitable for high-performance FET devices, the "active" (i.e., semiconductor) layer should exhibit single-phase crystal structure.

FIG. 3 depicts structure 300, which is a semiconductor-on-insulator wafer in accordance with an embodiment of the present invention. Structure 300 comprises substrate 302, layer 304 of a single-phase rare-earth dielectric material, and layer 306 of a single-phase active material. (Layer 304 is equivalent to layer 204 in FIG. 2.)

In some embodiments, substrate 302 is a standard silicon wafer having a <100> crystal orientation, as is well-known to those skilled in the art. In some other embodiments, substrate 302 is a silicon, but having a crystal orientation different than <100>, such as <111> silicon and <011> silicon. In some additional embodiments, the crystal orientation of the substrate is miscut away from the major axis by an angle of up to 10° (e.g., miscut <100> silicon, miscut <111> silicon, miscut <011> silicon, etc.). And in yet some further embodiments, substrate 302 is germanium or miscut germanium.

As described later in this specification, in some embodiments, one or more transitional layers are formed on substrate 302 before layer 304 of single-phase rare-earth dielectric is formed. These layers enable or at least promote the growth of single-phase rare-earth dielectric material. In structure 300, these layers are not explicitly depicted.

Layer 304 of a single-phase rare-earth dielectric (hereinafter "dielectric layer 304") is formed on and monolithically-integrated with substrate 302. Among any other purposes, dielectric layer 304 serves as a high-K dielectric that electrically isolates active layer 306 from substrate 302. In some embodiments, dielectric layer 304 comprises erbium oxide. Additional materials suitable for use as dielectric layer 304 include, without limitation:

Other rare-earth oxides, such as oxides of ytterbium, dysprosium, holmium, thulium, and lutetium;

Rare-earth nitrides, such as nitrides of erbium, ytterbium, dysprosium, holmium, thulium, and lutetium;

Rare-earth phosphides, such as phosphides of erbium, ytterbium, dysprosium, holmium, thulium, and lutetium;

Typically, the thickness of dielectric layer 304 is in the range of 0.5 to 5000 nanometers. For some embodiments, a thickness in the range of about 1 to 10 nanometers ("nm") is preferred.

Layer 306 of a single-phase semiconductor material (hereinafter "active layer 306") is formed on and monolithically-integrated with dielectric layer 304. In some embodiments, active layer 306 is a layer of single-phase semiconductor suitable for formation of high-performance integrated circuits. Exemplary semiconductors suitable for use as active layer 306 include silicon, silicon carbide, germanium, and silicon-germanium. In some additional embodiments, active layer 306 is a compound semiconductor, such as gallium arsenide, indium phosphide, and alloys of gallium arsenide and indium phosphide.

As described later in this specification, in some embodiments, one or more transitional layers are formed on dielectric layer 304 before active layer 306 is formed. These layers enable or at least promote the growth of single-phase semiconductor material. In structure 300, these layers are not explicitly depicted.

In some embodiments, active layer 306 has a thickness of about 50 nm; although, as a function of the application, active layer 306 can be grown to a different thickness.

Figure 4:
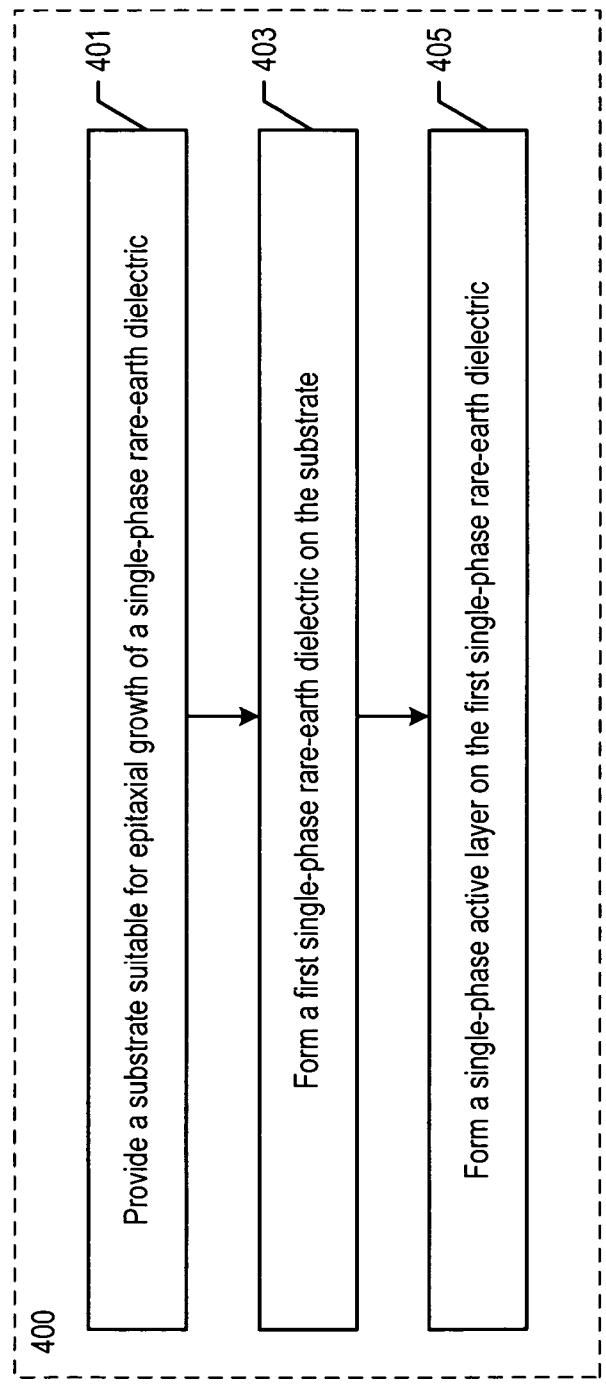
FIG. 4 depicts a method for forming the semiconductor-on-insulator structure that is shown in FIG. 3.

FIG. 4 depicts method 400 in accordance with an embodiment of the present invention. In some embodiments, method 400 is used to form semiconductor-on-insulator composition 300 shown in FIG. 3.

At operation 401 of method 400, a substrate that is suitable for epitaxial growth of a single-phase rare-earth dielectric, such as substrate 302, is provided. Suitable substrates have been disclosed above.

At operation 403, a layer of rare-earth dielectric having a single-phase crystal structure, such as dielectric layer 304, is formed using an epitaxial growth method, such as atomic layer epitaxy ("ALE").

In some embodiments, operation 403 is performed in an oxygen-rich environment. For such embodiments, the oxygen can be in any of the following forms:

i. unexcited molecular oxygen; or
ii. excited metastable molecular oxygen; or
iii. atomic oxygen; or
iv. isotropically pure oxygen; or
v. any combination of i, ii, iii, and iv.

In some embodiments, operation 403 utilizes an activated nitrogen species. Further details of operation 403—forming a layer of single-phase rare-earth dielectric—are provided later in this specification under Section IV.A.

At operation 405, an active layer having a single-phase crystal structure, such as active layer 306, is formed using an epitaxial growth method, such as ALE. Further details of operation 405 are provided later in this specification under Section IV.B.

In the illustrative embodiment, ALE is used to grow single-phase rare-earth dielectric material and single-phase semiconductor material. In some other embodiments, molecular-beam epitaxy is used to grow single-phase rare-earth dielectric material and single-phase semiconductor material. Alternative epitaxial techniques, such as liquid-phase epitaxy, vapor-phase epitaxy, and metal-organic chemical vapor deposition, could be used to grow single-phase rare-earth dielectric material and single-phase semiconductor material. The use of these techniques, however, requires the development of suitable precursors, which are currently unavailable.

Using variations of method 400, structures other than semiconductor-on-insulator composition 300 are formed. For example, in a first variation of method 400, operations 401 and 403 are performed, but operation 405 is omitted. The resulting structure consists of a layer of single-phase dielectric material on a substrate. See, for example, composition 200 of FIG. 2.

Figure 5A:
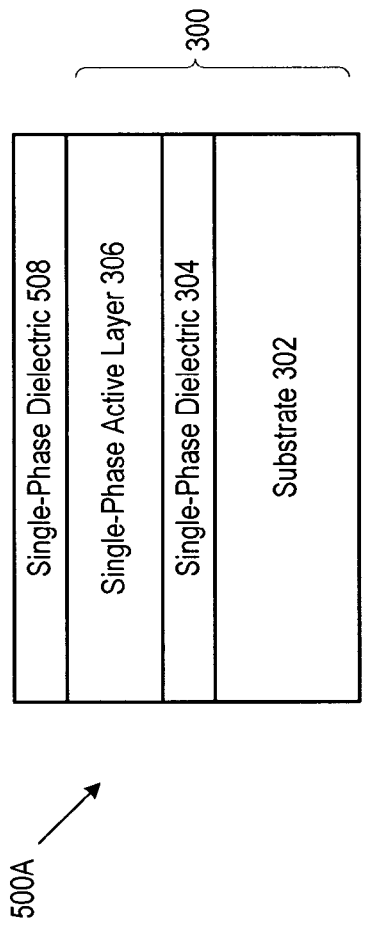
FIG. 5A depicts a composition comprising a single-phase rare-earth dielectric layer that is formed on the semiconductor-on-insulator structure of FIG. 3.

In a second variation of method 400, operation 403 (forming a single-phase dielectric layer) is repeated after performing operation 405. The resulting structure, which is depicted in FIG. 5A as structure 500A, includes dielectric layer 508 on semiconductor-on-insulator structure 300. Typically, the thickness of dielectric layer 508 in structure 500A is in the range of about 0.5 to about 5000 nanometers. In some embodiments, such as when dielectric layer 508 is to be used as a gate dielectric for a transistor, the thickness of dielectric layer 508 is preferably in the range of about 1 to about 10 nanometers.

It is notable that in various embodiments of the second variation of method 400, there are differences as to the way the two dielectric layers (e.g., layers 304 and 508) are formed. For example, in some embodiments, the operations that are used to form the dielectric layers differ as to:

the type(s) of transitional layer(s) that are used "under" the rare-earth dielectric;
the rare-earth dielectric that is used to form the layers; and
the presence or absence of transitional layer(s).

In some embodiments, however, the two dielectric layers are formed identically (e.g., same transitional layers, same rare-earth dielectric, etc.).

Figure 5B:
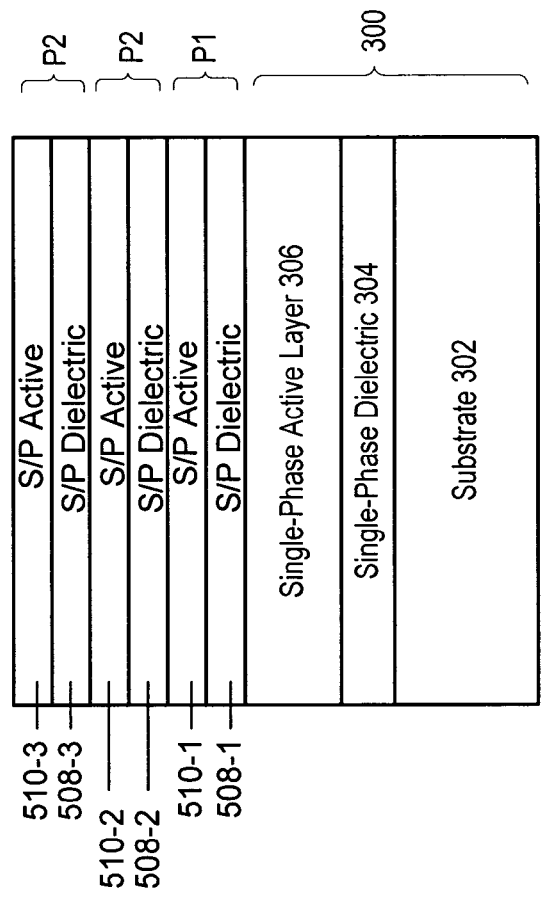
FIG. 5B depicts a composition comprising a periodic structure that is formed on the semiconductor-on-insulator structure of FIG. 3. Each period in the periodic structure comprises a layer of single-phase rare-earth dielectric material and a layer of active material, which in some embodiments is single-phase.

In yet a further variation of method 400, following the completion of operation 405, operations 403 and 405 are repeated one or more times to create a periodic structure. An example of a periodic structure formed using this variation of method 400 is structure 500B, which is depicted in FIG. 5B. Structure 500B includes semiconductor-on-insulator portion; that is, structure 300, and a periodic portion. In structure 500B, the periodic portion comprises three periods Pi, wherein i=1 to 3. Each period Pi includes a single-phase dielectric layer (508-$i$) and a single-phase active layer (510-$i$). There is no theoretical limit as to the number of times that operations 403 and 405 can be repeated to form a theoretically unlimited number of periods P.

Therefore, using method 400 and variations thereof, compositions can be formed that include, without limitation:

a basic arrangement having one, single-phase rare-earth dielectric layer on a substrate;
a single-phase semiconductor on a single-phase rare-earth insulator;
a semiconductor-on-insulator structure;
a single-phase dielectric layer on a semiconductor-on-insulator structure; and
a periodic structure on a semiconductor-on-insulator structure, wherein the periodic structure comprises n periods, n=1, ∞, and wherein each period comprises a single-phase rare-earth dielectric layer and single-phase active layer.

There are several important considerations pertaining to the formation of a single-phase dielectric layer (i.e., operation 403) and the formation of a single-phase active layer (i.e., operation 405). Consequently, further description of these operations is provided below.

IV.A. Methods for Forming Single-Phase Rare-Earth Dielectrics

Two important considerations in the formation of a single-phase rare-earth dielectric are:

1. The crystal structure of the unit cell of the rare-earth material; and
2. The surface state of the material on which the rare-earth material will be formed.

Figure 6:
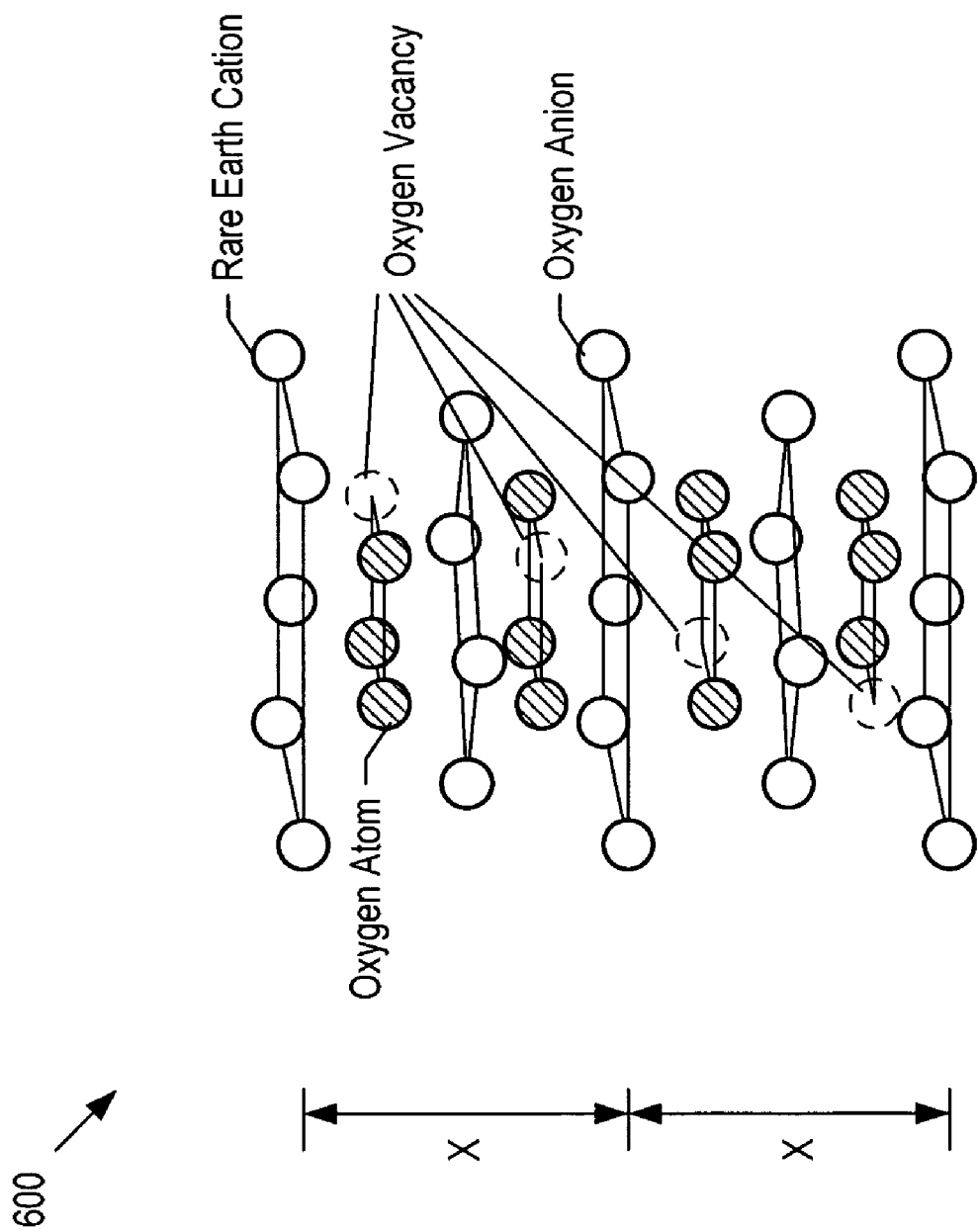
FIG. 6 depicts the crystal structure diagram of a unit cell of a rare-earth oxide having an oxygen-vacancy-derived fluorite derivative crystal structure, as is formed in some embodiments of the present invention.

Regarding the first consideration, FIG. 6 depicts the crystal structure diagram of unit cell 600 of a rare-earth oxide having the formula $RE_2O_3$ (where RE denotes a rare-earth metal atom, such as erbium, ytterbium, etc.), which in some embodiments is $Er^{+3}{}_2O_3$ (or, alternatively, $REO_{1.5}$). The crystal structure of unit cell 600 is an oxygen-vacancy-derived fluorite derivative (i.e., Bixbyite structure). In some embodiments, unit cell 600 is an oxygen-rich bixbyite structure having the formula $Er^{+3}O_{1.5+x}$ or an oxygen-poor bixbyite structure having the formula $Er^{+3}O_{1.5-x}$, where x is in the range of 0 to 1.5. It will be understood that Bixbyite crystal structure is $REO_{1.5}$. As used in this specification, however, the term "Bixbyite" is intended to include oxygen-rich and oxygen-poor variations of this structure as well. In some embodiments, unit cell 206 of composition 200 (FIG. 2) possesses this structure. And, in some embodiments, dielectric layers 304 (see FIG. 3) and 508 (see FIG. 5A) comprise an assemblage of these unit cells.

The number and position of the anion (e.g., oxygen, etc.) vacancies determines the crystal shape of the $RE_2O_3$ unit cell. The crystal shape of this cell can be engineered to provide a suitable match to the lattice constant of the underlying semiconductor substrate and to induce a desired strain (tensile or compressive) in the dielectric layer and/or overgrown layers. This is described in more detail in co-pending U.S. patent application Ser. No. 11/253,525.

Rare-earth dielectric layers that utilize lighter rare-earth metals (i.e., rare-earth metals with atomic number below 66) exhibit a cubic calcium-fluoride-type crystal structure due to the +4 ionization state of their rare-earth metals. These lighter rare-earth metals form cations with cation radii larger than 0.95 angstroms. Polymorphs of rare-earth dielectrics with cation radii larger than 0.95 angstroms are unstable and are not limited to a single type over all temperatures. Therefore, rare-earth dielectrics formed using these rare-earth elements will exhibit polycrystalline or multi-domain crystal structure. Such dielectrics are, therefore, undesirable for use in high-performance electronics.

The rare-earth dielectric polymorphs for rare-earth metals with atomic number greater than or equal to 66, however, are stable over the temperature range from room temperature to 2000° C. These polymorphs include sesquioxides that have a cation radius less than 0.93. The rare-earth elements that have cation radii less than 0.93 include dysprosium, holmium, erbium, thulium, ytterbium, and lutetium. These rare-earth metals, therefore, will form a stable oxygen-vacancy-derived fluorite crystal structure (i.e., bixbyite) that exhibits single-phase structure. Consequently, rare-earth metals that are suitable for use in conjunction with embodiments of the present invention include dysprosium, holmium, erbium, thulium, ytterbium, and lutetium.

The second important consideration listed above is the surface state of the material on which the rare-earth dielectric is to be deposited. It was previously disclosed that rare-earth dielectrics typically comprise polar crystals. Therefore, in order to form a single-phase rare-earth dielectric on a substrate, the surface of the substrate must provide energetically-favorable bonding sites for one (but not both) of the anions or cations in the rare-earth dielectric.

Silicon and germanium, which are non-polar, provide no preferential bonding sites. As a consequence, formation of the rare-earth dielectric layer on a non-polar substrate can initiate with either anions or cations in different areas with equal probability, resulting in a multi-domain material. This type of non-preferential growth, which does not result in single-phase material, was illustrated via composition 100 of FIG. 1.

Several techniques have been discovered that provide a surface that enables or promotes epitaxial growth of single-phase rare-earth dielectrics that have a bixbyite oxygen-vacancy-ordered crystal structure. These techniques include:

1. providing an anion or cation terminated surface;
2. compensation of the semiconductor surface using an oxide or nitride;
3. preferential growth on miscut semiconductor wafers;
4. compensation of the semiconductor surface with material having a rock-salt crystal structure having a non-polar surface, such as the <001> surface of ytterbium-monoxide (YbO) or the <001> surface of erbium nitride; and
5. anion ordering using a short-period super-lattice.

The techniques listed above are described below and with respect to FIGS. 7A-B, 8A-B, 9A-B, 10A-B, and 11A-B.

These techniques can be considered to be sub-operations of operation 401 of method 400.

Technique 1—Providing an Anion or Cation-Terminated Surface

Figure 7A:
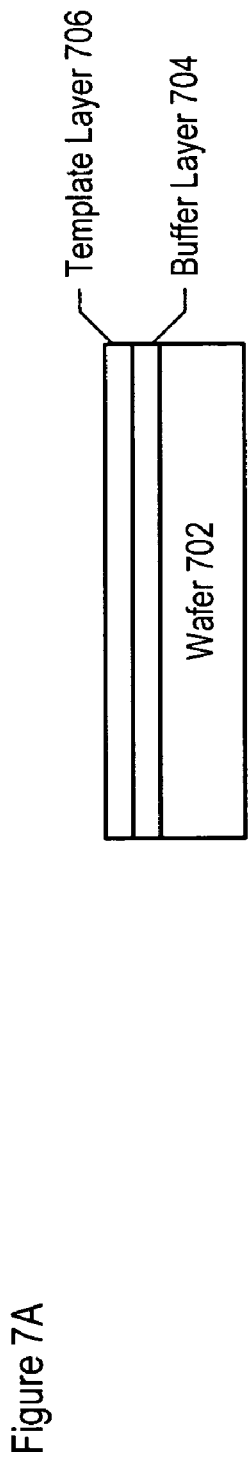
FIG. 7A depicts a first composition for enabling/promoting the formation of a layer of single-phase rare-earth dielectric material, wherein the first composition includes a buffer layer (optional) and a template layer.

FIG. 7A depicts a composition that includes wafer 702, buffer layer 704, and template layer 706. In some embodiments, these layers collectively represent substrate 302 of composition 300 of FIG. 3. As described further below, template layer 704 provides energetically-favorable bonding sites for rare-earth oxide anions (or cations), according to an embodiment of the present invention.

Figure 7B:
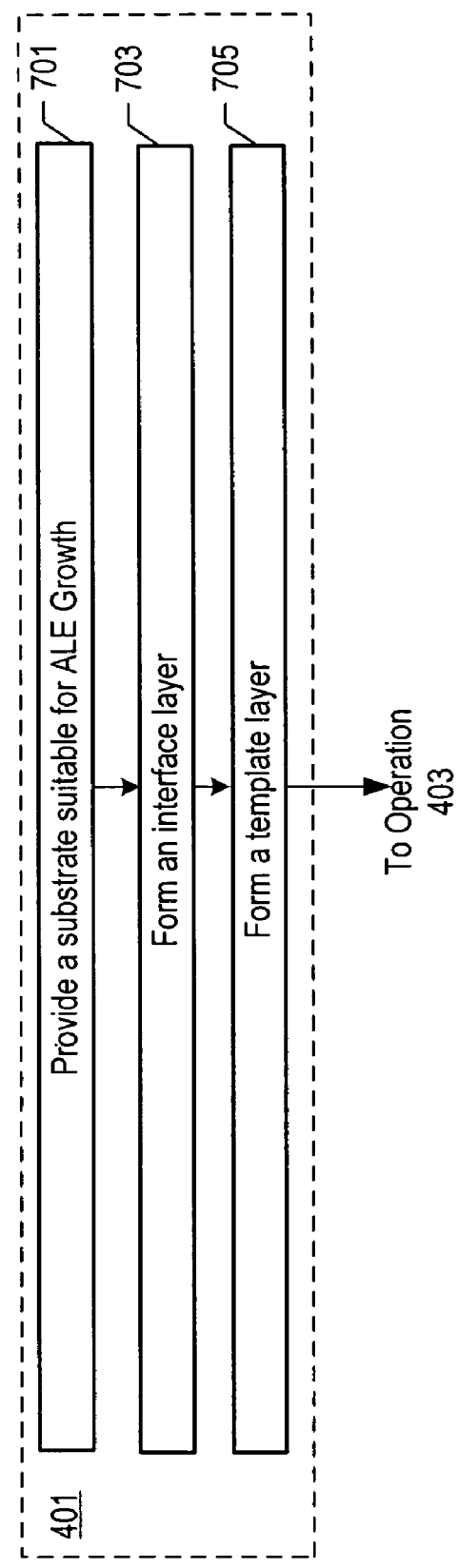
FIG. 7B depicts operations for forming the first composition of FIG. 7A.

FIG. 7B depicts the details of operation 401 of method 400, when utilizing Technique 1. According to sub-operation 701, a semiconductor substrate suitable for ALE growth, such as wafer 702, is provided. Wafer 702 comprises a silicon wafer having a <001> crystal orientation. Alternatively, wafer 702 could be any of the substrate types listed previously with respect to substrate 302. The phrase "suitable for ALE growth" means possessing sufficient quality, purity, and cleanliness as to be acceptable for use in high-vacuum crystal growth apparatus (e.g., the wafer is free of metals, organic materials, and alkali surface contaminants, etc.). In some embodiments, operation 701 further comprises removal of any native oxide on wafer 702, as is known to those skilled in the art.

At optional operation 703, single-phase silicon buffer layer 704 is formed on wafer 702 using an epitaxial-growth method, such as ALE. The addition of a buffer layer on wafer 702 can improve the planarity of the substrate surface and also provide a lower defect surface.

At operation 705, template layer 706 is formed on wafer 702 (or on silicon buffer layer 704) using an epitaxial-growth method, such as ALE. Deposition of template layer 706 proceeds such that a reconstructive surface is maintained.

In some embodiments, template layer 706 provides an energetically-favorable bonding surface for cations that are present in rare-earth dielectric 304 by terminating the non-polar silicon bonds with anions (see, e.g., anion-terminated surface 216 of FIG. 2). Thus, the combination of wafer 702 and template layer 706 serves as the substrate (i.e., substrate 302) upon which the rare-earth dielectric 304 is grown. During epitaxial growth, the surface mobility of the rare-earth cations promotes the growth of the rare-earth dielectric in the same manner across the entire surface of the substrate, thereby forming a single-phase crystalline layer.

In some embodiments that provide an anion-terminated surface, template layer 706 is silicon dioxide, silicon nitride, or silicon oxynitride. Since silicon dioxide, silicon nitride, and silicon oxynitride are amorphous, they should be present as no more than a few monolayers. Although amorphous in thicker layers, these materials will retain an underlying crystal structure when present as only a few monolayers. In still other embodiments, template layer 706 comprises a rare-earth nitride layer, such as erbium nitride. In yet some embodiments, template layer 706 comprises a rare-earth phosphide.

In some embodiments, template layer 706 comprises a silicon oxide layer that is oxygen deficient (i.e., $SiO_x$, where x is less than 2). In some other embodiments, template layer 706 comprises a layer of $SiO_x$, where x is less than 1. In order to form oxygen-deficient template layers, $SiO_x$ is grown using a dilute langmuir coverage of molecular oxygen, metastable molecular oxygen, and/or atomic oxygen species. Operation 705, wherein oxygen-deficient $SiO_x$ template layers are formed can comprise:

i. deposition using oxygen species reacting with a silicon surface; or ii. co-deposition with a flux of oxygen species along with flux of elemental silicon atoms; or iii. deposition using a flux of elemental silicon and oxygen atoms and/or silicon-oxygen molecules obtained by the evaporation of pure stoichiometric silicon dioxide $SiO_2$ source material; or iv. co-deposition using the evaporation of stoichiometric silicon dioxide source material and elemental silicon; or v. any combination of i, ii, iii, and iv.

In some embodiments, template layer 706 provides an energetically-favorable bonding surface for anions that are present in rare-earth dielectric 304 by terminating the non-polar semiconductor (e.g., silicon, etc.) bonds with cations. During epitaxial growth, the surface mobility of the rare-earth anions promotes the growth of the rare-earth dielectric in the same manner across the entire surface of the substrate, thereby forming a single-phase crystalline layer.

In some embodiments that provide a cation-terminated surface, template layer 706 is one or more monolayers of rare-earth cations, such as a rare-earth metal (e.g., $Er^{+3}$, etc.).

Once template layer 706 has been formed, operation 403 of method 400—formation of dielectric layer 304—can be conducted. In the illustrative embodiment, layer 304 comprises a rare-earth oxide, such as a single-phase layer of $Er^{3+}_2O_3$, having thickness of about 5 microns. Dielectric layer 304 is formed on template layer 706 using an epitaxial-growth method such as ALE, using effusion cells capable of the evaporation of 99.99+% purity erbium.

Template-initiated growth of c-Erbium Oxide ("ErOx") exhibits RHEED patterns with 4-fold symmetry. Typical quadrature patterns of ~500 A of c-ErOx depict good RHEED patterns at $10^{-7}$ Torr oxygen background, but RHEED intensity increases dramatically when the oxygen background is reduced below ~$2.5 \times 10^{-8}$ Torr. Crystal quality also increases as growth temperature increases from 500 to 750° C. When dielectric layer 304 comprises $Er^{3+}_2O_3$, suitable growth conditions include a growth temperature of 750° C, in an oxygen background pressure of less than $2.5 \times 10^{-8}$ Torr.

It was previously disclosed that the number and position of the anion vacancies determines the crystal shape of the $RE_2O_3$ unit cell. The crystal shape of this cell can be engineered to provide a suitable match to the lattice constant of the underlying semiconductor substrate. Oxygen vacancies along the body diagonal and/or the face diagonal lead to a C-type cubic structure. For example, two anion vacancies per fluorite unit cell causes the unit cell of $Er^{3+}_2O_3$ to increase to nearly twice the unit cell size of Si. This, in turn, enables low-strain, single-phase $Er^{3+}_2O_3$ to be epitaxially grown directly on a silicon substrate.

EXAMPLE 1 FOR TECHNIQUE 1 DEPOSITION OF AN OXYGEN-MONOLAYER AS TEMPLATE LAYER 706

For this growth, template layer 706 comprised a monolayer of oxygen atoms, thereby providing an anion-terminated surface, and thereby providing an energetically-favorable bonding surface for cations (i.e., rare-earth metal cations). The oxygen atoms terminated the semiconductor (e.g., silicon) bonds that were available at the surface of wafer 702.

Template layer 706 was grown on wafer 702 at a temperature in the range of 300° C. to 500° C. and in an atmosphere of $10^{-7}$ Torr oxygen background pressure, consistent with operation 705. ALE was used to grow the template layer. In some other embodiments, the ALE is conducted at a temperature in the range of 500° C. to 700° C. and in an atmosphere of $10^{-8}$ Torr oxygen background pressure. In this example, as well as alternative embodiments, ultra-low beam pressure plasma sources are used for the production of atomic and metastable oxygen species.

EXAMPLE 2 FOR TECHNIQUE 1 DEPOSITION OF SILICON DIOXIDE AS TEMPLATE LAYER 706

In this example, template layer 706 comprised a few monolayers of silicon dioxide molecules, thereby providing an anion-terminated surface. Silicon dioxide was deposited using ALE, which was conducted at a temperature in the range of 300° C. to 500° C. and in an atmosphere of $10^{-7}$ Torr oxygen background pressure. In some embodiments, ALE is conducted at a temperature in the range of 500° C. to 700° C. and in an atmosphere of $10^{-8}$ Torr oxygen background pressure.

EXAMPLE 3 FOR TECHNIQUE 1 DEPOSITION OF A RARE-EARTH AS TEMPLATE LAYER 706

In this example, template layer 706 comprised 1-10 monolayers of erbium atoms, deposited on wafer 702 using ALE. Template layer 706, therefore, provided a cation-terminated surface which provides an energetically-favorable bonding surface for cations. Template layer 706 was formed using ALE to deposit erbium atoms. Growth conditions for erbium template layer 706 included a growth temperature in the range from 25° C. to approximately 700° C., at a maximum oxygen background pressure of $10^{-9}$ Torr.

Technique 2—Compensation with an Oxide or a Nitride

Figure 8A:
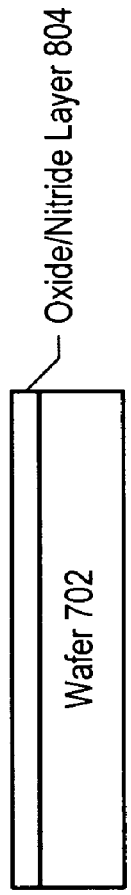
FIG. 8A depicts a second composition for enabling/promoting the formation of a layer of single-phase rare-earth dielectric material, wherein the first composition includes an oxide or a nitride layer.

FIG. 8A depicts a composition that includes wafer 702 and oxy-nitride or nitride layer 804. In some embodiments, these layers collectively represent substrate 302 of composition 300 of FIG. 3. As described further below, oxy-nitride or nitride layer 804 provides a preferential growth surface for cations 108.

Figure 8B:
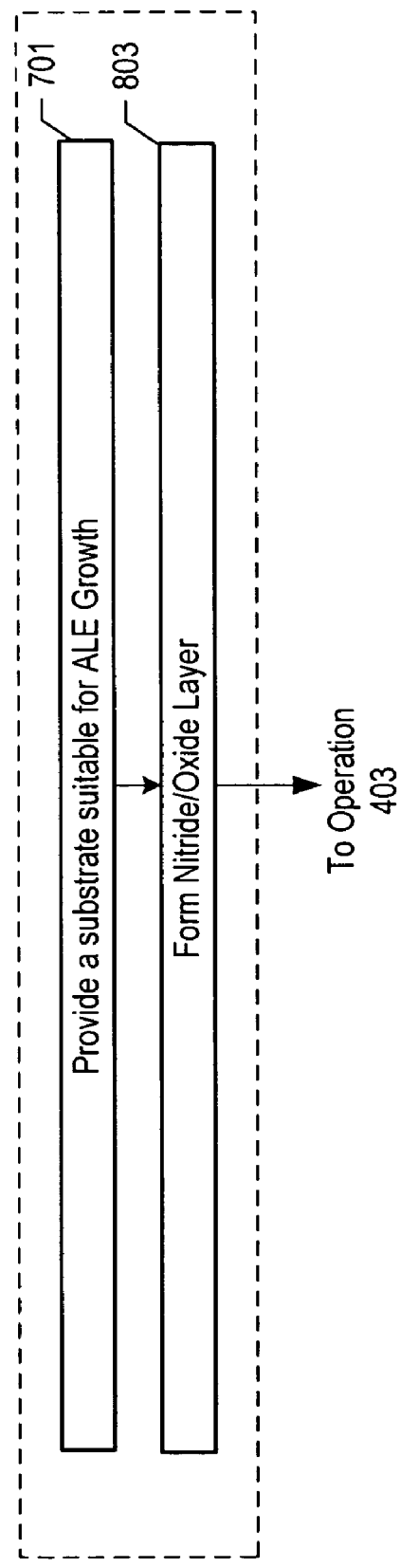
FIG. 8B depicts operations for forming the second composition of FIG. 8A.

FIG. 8B depicts the details of operation 401 of method 400, when utilizing Technique 2. According to sub-operation 701, a semiconductor substrate suitable for epitiaxial-growth, such as wafer 702, is provided. In sub-operation 803, a nitride layer is formed on wafer 702. The nitrogen species is supplied by metastable diatomic nitrogen and/or atomic nitrogen, and/or metastable nitrous oxide ($N_2O$ or NO), and/or conventional nitrous oxide.

Technique 3—Preferential Growth on Mis-Cut Wafers

Figure 9A:
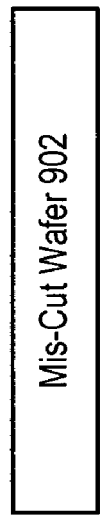
FIG. 9A depicts a third composition for enabling/promoting the formation of a layer of single-phase rare-earth dielectric material, wherein the third composition includes a miscut wafer.

FIG. 9A depicts a composition that includes miscut wafer 902. In some embodiments, miscut wafer 902 represents substrate 302 of composition 300 of FIG. 3. As previously indicated, using a miscut wafer enables single-phase growth of a layer of rare-earth dielectric directly on the wafer without the use of a transitional layer.

Figure 9B:
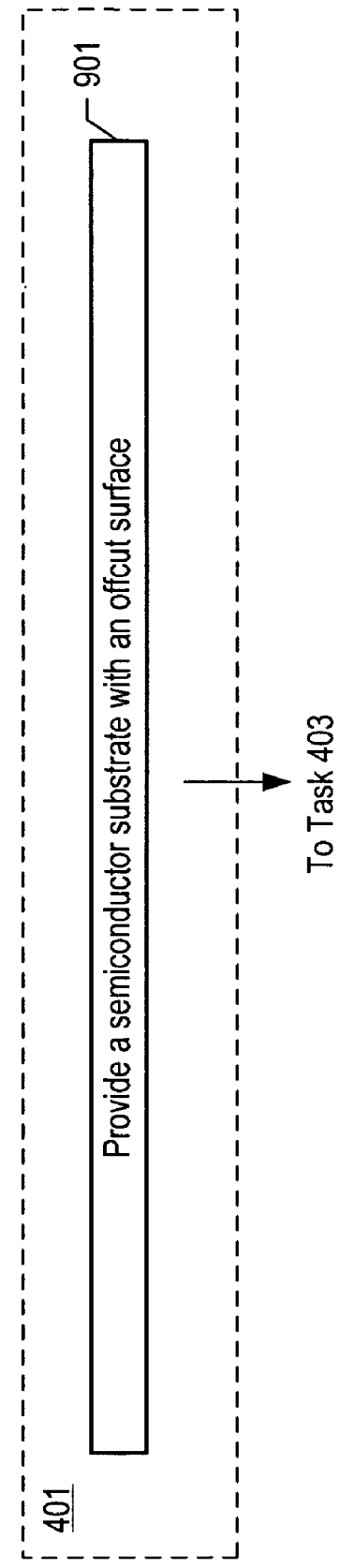
FIG. 9B depicts operations for forming the third composition of FIG. 9A.

FIG. 9B depicts the details of operation 401 of method 400, when utilizing Technique 3. According to sub-operation 901, a miscut wafer is provided. In some embodiments, wafer 902 is a <100> silicon wafer, wherein the crystalline orientation of the wafer is cut at an angle of about 6° from the <100> surface toward the <110> direction. In some other embodiments, wafer 902 is miscut germanium wafer.

Figure 10A:
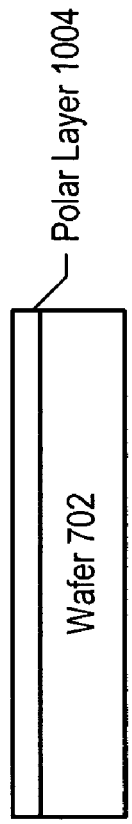
FIG. 10A depicts a fourth composition for enabling/promoting the formation of a layer of single-phase rare-earth dielectric material, wherein the fourth composition includes a polar layer.

Technique 4—Compensation of the Substrate with a Material Having a Rock-Salt Crystal Structure FIG. 10A depicts a composition that includes wafer 702 and polar layer 1004. Wafer 702 and polar layer 1004 collectively represent substrate 302 of composition 300 of FIG. 3. As described further below, polar layer 1004 provides a polar surface that is favorable for epitaxial growth of a single-phase rare-earth dielectric, such as $Er^{3+}{}_2O_3$.

Polar layer 1004 comprises a material having a rock-salt crystal structure. Materials having a rock-salt crystal structure include, without limitation, ytterbium monoxide (YbO) and erbium nitride (ErN).

YbO and ErN are different from most of the rare-earth dielectrics previously described to the extent that it forms the crystal structure of rock-salt, rather than bixbyite. The crystal structure of rock-salt is well-known to those skilled in the art. Depending upon growth conditions, a layer of YbO can form either a polar or non-polar surface. For example, the <001> surface of YbO has anions and cations that are evenly distributed in the same plane, thereby providing a non-polar surface. Alternatively, the <111> surface of YbO provides a polar surface. Therefore, YbO can be used to change the surface state of a non-polar surface to polar or, alternatively, to change the surface of a polar surface to non-polar.

In addition, YbO has a lattice constant that is closely-matched to the lattice constant of silicon. Therefore, YbO provides a low-strain means of terminating the non-polar silicon surface and providing a polar surface that is favorable for epitaxial growth of a single-phase rare-earth dielectric, such as $Er^{3+}{}_2O_3$.

Figure 10B:
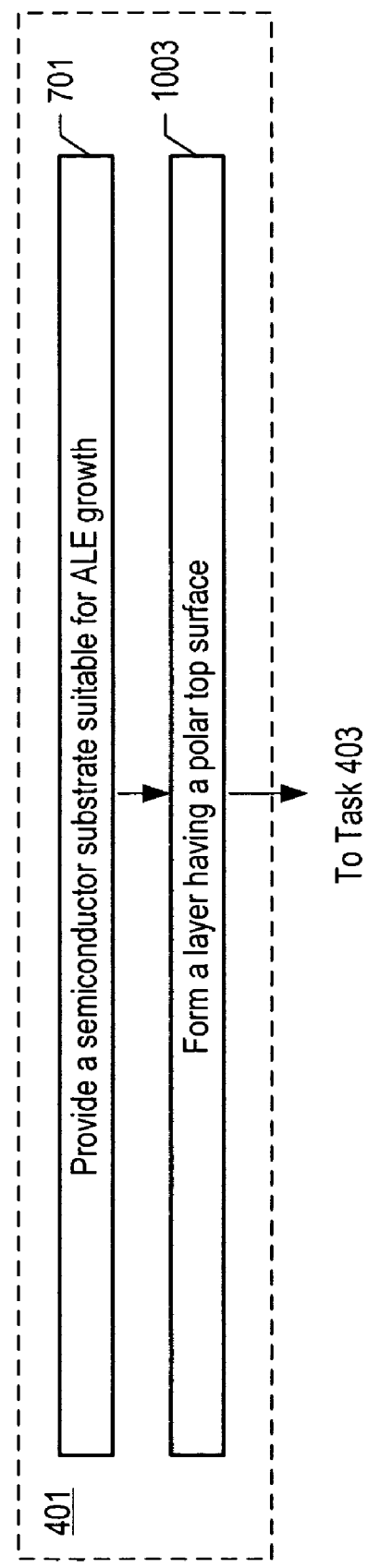
FIG. 10B depicts operations for forming the fourth composition of FIG. 10A.

FIG. 10B depicts the details of operation 401 of method 400, when utilizing Technique 4. At operation 1001, wafer 702 is provided as per method 700B.

At operation 1003, polar layer 1004, is formed on wafer 702. The thickness of polar layer 1004 can range from 0.1 nm to 0.1 microns. More typically, the thickness of layer 1004 is about 1 to 2 nm, which represents several monolayers. Growth conditions for forming polar layer 1004, comprising YbO, include a growth temperature that ranges from about 25 to 700° C., with beam fluxes of Ytterbium of $10^{-8}$ to $10^{-7}$ Torr, and a oxygen background pressure of $10^{-8}$ to $10^{-6}$ Torr.

In some embodiments, polar layer 1004 is formed by epitaxially-depositing YbO or ErO. In some embodiments, ALE is used for the epitaxial deposition process.

In some embodiments, rare-earth dielectric 304 is the same material as polar layer 1004 (e.g., YbO, etc.), such that operation 404 (formation of a layer of a single phase rare-earth dielectric) is accomplished by simply continuing operation 1003.

Technique 5—Anion Ordering Using a Short-Period Super Lattice

Figure 11A:
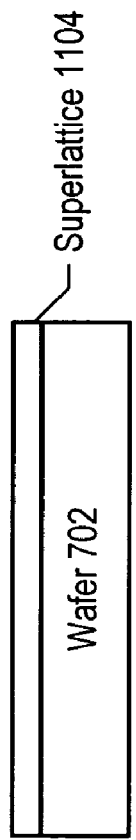
FIG. 11A depicts a fifth composition for enabling/promoting the formation of a layer of single-phase rare-earth dielectric material, wherein the fifth composition includes a super-lattice for anion ordering.

FIG. 11A depicts a composition that comprises wafer 702 and super-lattice 1104. In composition 1100A, wafer 702 and superlattice 1104 represent substrate 302 of composition 300. Superlattice 1104 compromises layer structure that enables (i) the strain due to lattice mismatch and (ii) the anion ordering to be engineered, as desired.

In some embodiments, super-lattice 1104 comprises alternating cation-rich and anion-rich layers of the same material. For example, in some of these embodiments, super-lattice 1104 comprises alternating layers of oxygen-rich erbium oxide, as represented by the formula $ErO_{1.5+y}$, and oxygen-poor erbium oxide, as represented by the formula $ErO_{1.5-x}$, where x and y are less than one. In some other embodiments, super-lattice 1104 comprises alternating layers of oxygen-rich ytterbium oxide and oxygen-poor ytterbium oxide.

In some other embodiments, super-lattice 1104 comprises alternating cation-rich and anion-rich layers of different materials. For example, in some of these embodiments, super-lattice 1104 comprises alternating layers of oxygen-rich erbium oxide and oxygen-poor ytterbium oxide.

In some further embodiments, super lattice 1104 comprises alternating layers of erbium oxide and erbium nitride, which act to order the bixbyite oxygen vacancies.

Figure 11B:
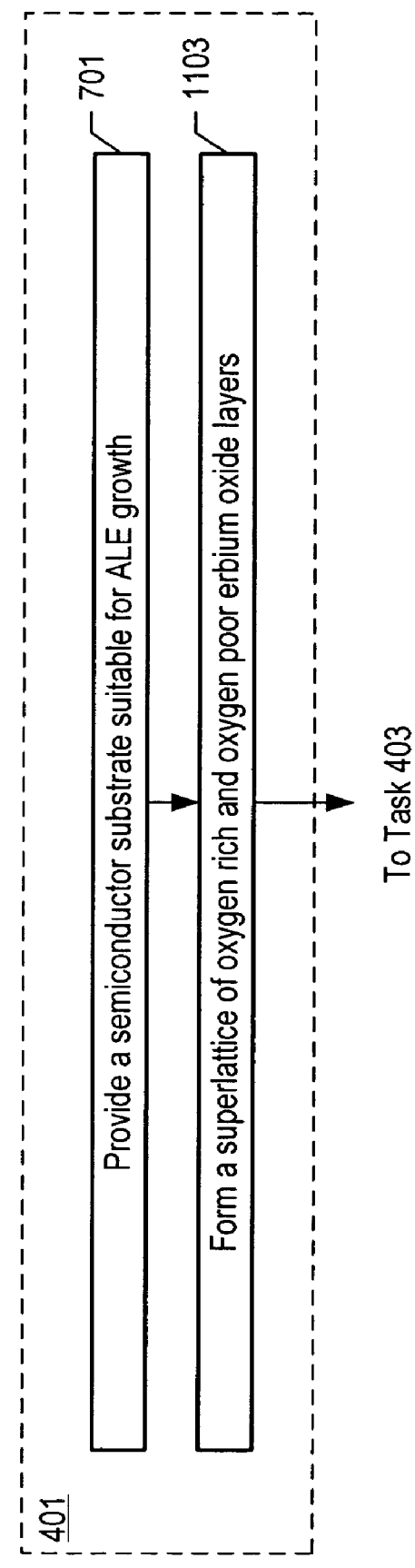
FIG. 11B depicts operations for forming the fifth composition of FIG. 10A.

FIG. 11B depicts the details of operation 401 of method 400, when utilizing Technique 5. At operation 1101, wafer 702 is provided as per method 700B. The layers comprising super-lattice 1104 are epitaxially-deposited, such as via ALE. To produce oxygen-rich or oxygen poor material, growth conditions are suitably altered. For example, to produce oxygen-rich erbium oxide, an oxygen overpressure is provided relative to the erbium partial pressure. And to produce oxygen-poor erbium oxide, an erbium overpressure is provided relative to the oxygen partial pressure. An additional technique for growing oxygen poor erbium oxide includes the introduction of nitrogen into the gas flow.

IV.B Active Layer Epitaxy on Single-Phase Rare-Earth Dielectrics

It is desirable for semiconductor-on-insulator structure 300 (FIG. 3) to be suitable, in at least some embodiments, for producing high-performance FET devices. For such embodiments, active layer 306 should possess single-phase crystal structure.

A preferred deposition surface for silicon (or germanium) epitaxy is non-polar, since silicon, germanium, and silicon-germanium are non-polar crystals. Since most rare-earth dielectrics typically comprise polar crystals, epitaxial-growth of silicon or germanium on a rare-earth dielectric has proven to be problematic. Stress at the interface and lattice-constant mismatch are two critical issues that must be addressed in order to form a single-phase active layer on a rare-earth dielectric.

Several methods have been found to provide a rare-earth dielectric surface that enables epitaxial growth of single-phase non-polar semiconductors, such as silicon and germanium. These methods are described below.

Figure 12A:
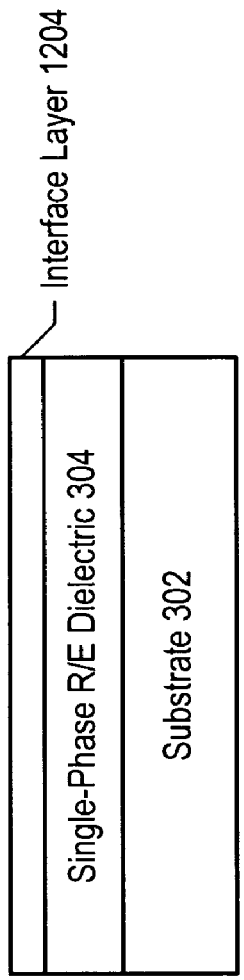
FIG. 12A depicts a first composition for enabling/promoting the formation of a layer of single-phase semiconductor layer, wherein the first composition includes an interface layer.

FIG. 12A depicts a composition that includes substrate 302, first dielectric layer 304, and interface layer 1204. Methods for preparing substrate 302 and first dielectric layer 304 have already been described. It is understood that substrate 302 of FIG. 12A includes transitional layers, to the extent that they are present, as depicted in FIGS. 7A, 8A, 10A, and 11A.

Figure 12B:
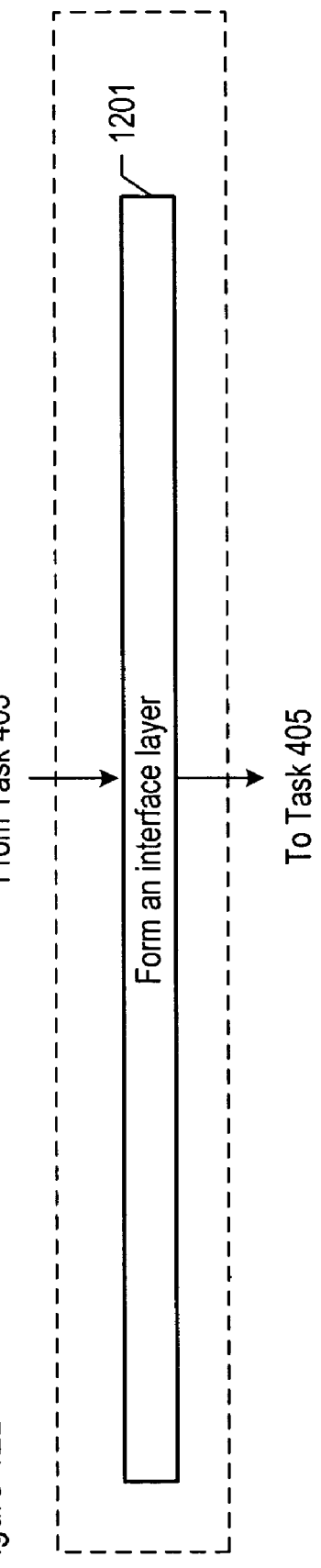
FIG. 12B depicts operations for forming the first composition of FIG. 12A.

The focus here is how to form a single-phase active layer "on" a layer of rare-earth dielectric. One way to do so is depicted in FIG. 12B. Turning now to FIG. 12B, at operation 1201, interface layer 1204 is formed on dielectric 304 using an epitaxial-growth method, such as ALE. In some embodiments, interface layer 1204 is a rare-earth nitride, such as erbium nitride. Erbium nitride has a rock-salt crystal structure that can have a surface character that is either polar or non-polar. Erbium nitride, therefore, can provide a change in the character of the growth surface for active layer 306 from polar (i.e., the surface character of erbium oxide) to non-polar. In some embodiments in which erbium nitride is used for interface layer 1204, the thickness of that layer is less than five monolayers.

Growth conditions for forming a layer of ErN suitable for interface layer 1204 include the use of atomic nitrogen and/or metastable nitrogen. The nitrogen species is supplied by metastable diatomic nitrogen, and/or atomic nitrogen, and/or metastable nitrous oxide ($N_2O$ or NO), and/or conventional nitrous oxide. The erbium can be supplied in either erbium-poor, equivalent, or erbium rich beam flux relative to the nitrogen.

In addition to changing the character of the growth surface to enable deposition of active layer 306, rare-earth nitrides, such as erbium nitride, also provide a diffusion barrier to boron. This is important since boron can be diffused or implanted into active layer 306 to form transistors, etc. In the absence of a suitable diffusion barrier, boron that was implanted in active layer 306 can diffuse into dielectric layer 304. The presence of boron in dielectric layer 304 has deleterious effects on the performance of composition 300 when used for the fabrication of high-performance integrated circuits and devices.

In some embodiments of the present invention, interface layer 1204 comprises a layer of YbO. Like erbium nitride, YbO has a rock-salt crystal structure, which can provide a surface character that is either polar or non-polar. YbO, therefore, can also provide a change in the character of the growth surface for active layer 306 from polar (i.e., the surface character of erbium oxide) to non-polar. In still some other embodiments of the present invention, dielectric layer 304 comprises YbO, such that interface layer 1204 is a continuation of dielectric layer 304.

After interface layer 1204 is formed, single-phase active layer 306 is formed (on the interface layer 702), in accordance with operation 405 of method 400.

Figure 13A:
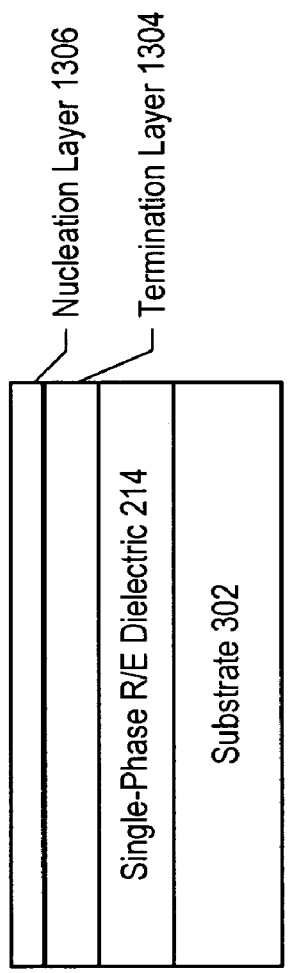
FIG. 13A depicts a second composition for enabling/promoting the formation of a layer of single-phase semiconductor layer, wherein second composition includes a termination layer and an optional nucleation layer.
Figure 13B:
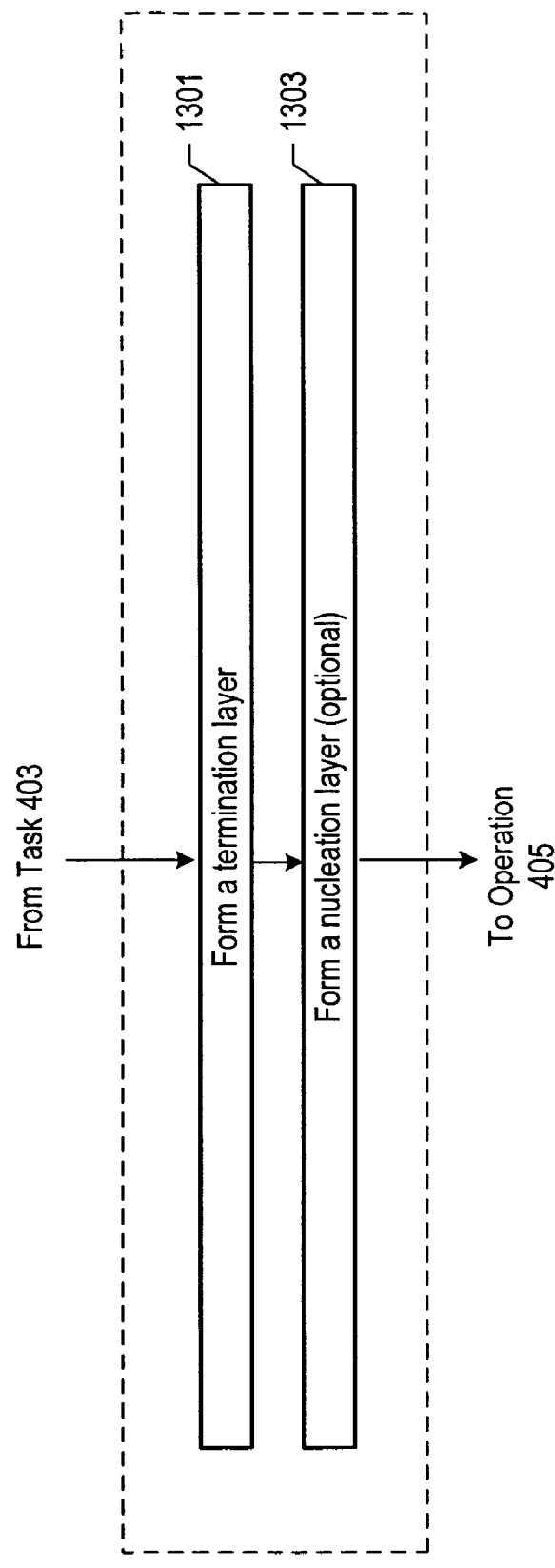
FIG. 13B depicts operations for forming the second composition of FIG. 13A.

FIG. 13B depicts another way to form a single-phase active layer "on" a rare-earth dielectric. FIG. 13A depicts a composition that includes substrate 302, first dielectric layer 304, termination layer 1304, and optional nucleation layer 1306. Methods for preparing substrate 302 and first dielectric layer 304 have already been described.

Termination layer 1304 provides a surface having surface energy greater than the sum of (1) the surface energy of active layer 306 and (2) the interface energy. This condition of high surface energy promotes high surface species mobility, which in turn promotes two-dimensional, layer-by-layer growth of active layer 306.

At operation 1301, termination layer 1304 is formed on dielectric 304 using an epitaxial-growth method, such as ALE. In some embodiments, termination layer 1304 is a layer of rare-earth atoms that terminate the bonds on the surface of dielectric 304. In some other embodiments, termination layer 1304 is a layer of oxygen atoms. In some further embodiments, termination layer 1304 is a layer of erbium nitride molecules. The thickness of termination layer 1304 is typically within a range of about one monolayer to ten monolayers, with typical thickness of less than 5 monolayers.

At operation 1303, nucleation layer 1306 is optionally formed on termination layer 1304 using an epitaxial-growth method, such as ALE. Nucleation layer 1306 is a layer of low-growth-temperature semiconductor material, which initiates two-dimensional, layer-by-layer growth of active layer 306 material. In some embodiments, nucleation layer 1306 comprises silicon. Other materials suitable for use in nucleation layer 1306 include, without limitation, germanium, silicon-germanium, gallium arsenide, indium phosphide, and silicon carbide.

After termination layer 1204 or optional nucleation layer 1306 is formed, single-phase active layer 306 is formed (on the interface layer 702), in accordance with operation 405 of method 400.

V Experimental Results

Experiment #1

Figure 14:
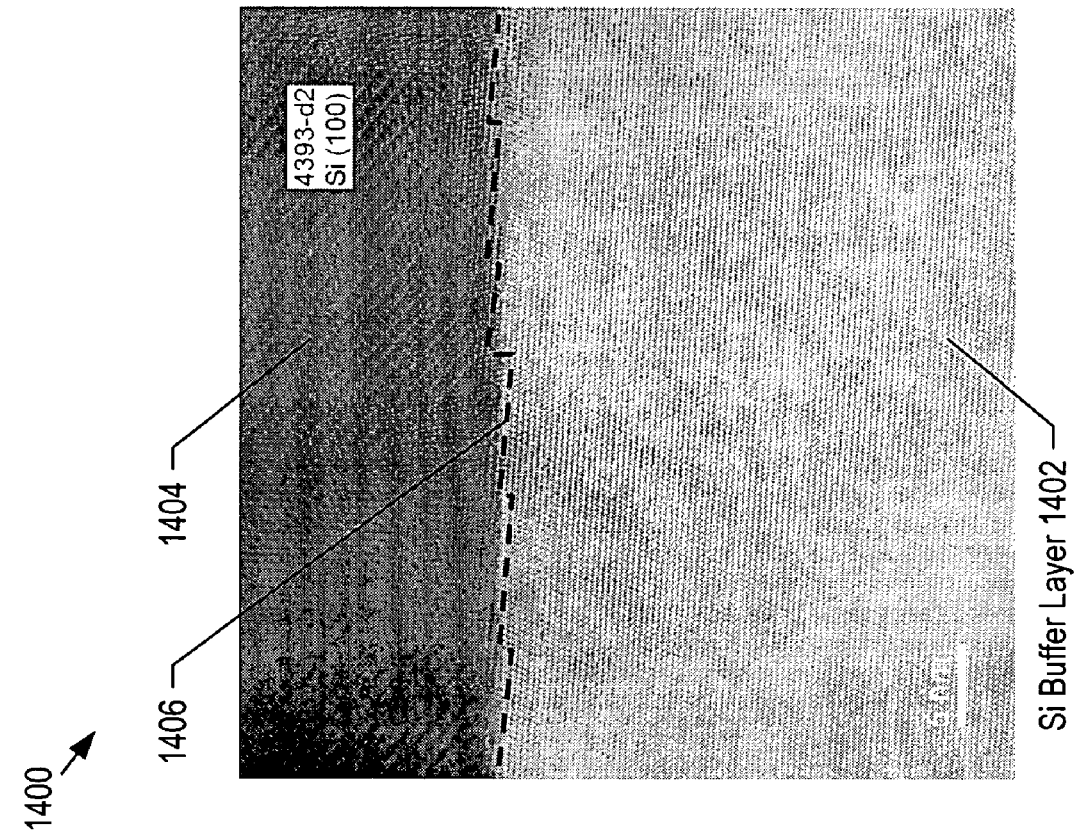
FIG. 14 depicts a Transmission Electron Micrograph (TEM) of layer structure 1400.

FIG. 14 depicts a Transmission Electron Micrograph (TEM) of layer structure 1400. Layer structure 1400 is a portion of an SOI substrate grown in a fashion consistent with the present invention. Layer structure 1400 comprises silicon buffer layer 1402 and single-phase rare-earth dielectric 1404.

Silicon buffer layer 1402 is an epitaxially-grown silicon layer that comprises surface 1406, which is a terraced <111> surface that is oriented 3.7° toward the <110> crystal direction. Silicon buffer layer 1402 provides an energetically-favorable surface for one of either cations or anions during growth of single phase rare-earth dielectric 1404. The promoted species (i.e., cations or anions) is the one that is present in greater number. Silicon buffer layer 1402 was grown by ALE at a temperature of 600° C. in an oxygen background pressure of less than $10^{-10}$ Torr. More generally, silicon buffer layer 1402 can be grown at a temperature that is within a range of about 500° to 700° C.

Single-phase dielectric 1404 is a single-phase layer of $Er^{+3}{}_2O_3$, grown on silicon buffer layer 1402 by ALE. Dielectric 1404 was grown using an oxygen template layer that was formed using a molecular oxygen source in an oxygen background atmosphere of $10^{-8}$ Torr. Dielectric 1404 was grown by ALE at a temperature of 700° C. in an oxygen background atmosphere of $10^{-7}$ Torr.

Experiment #2

Figures 15A, 15B:
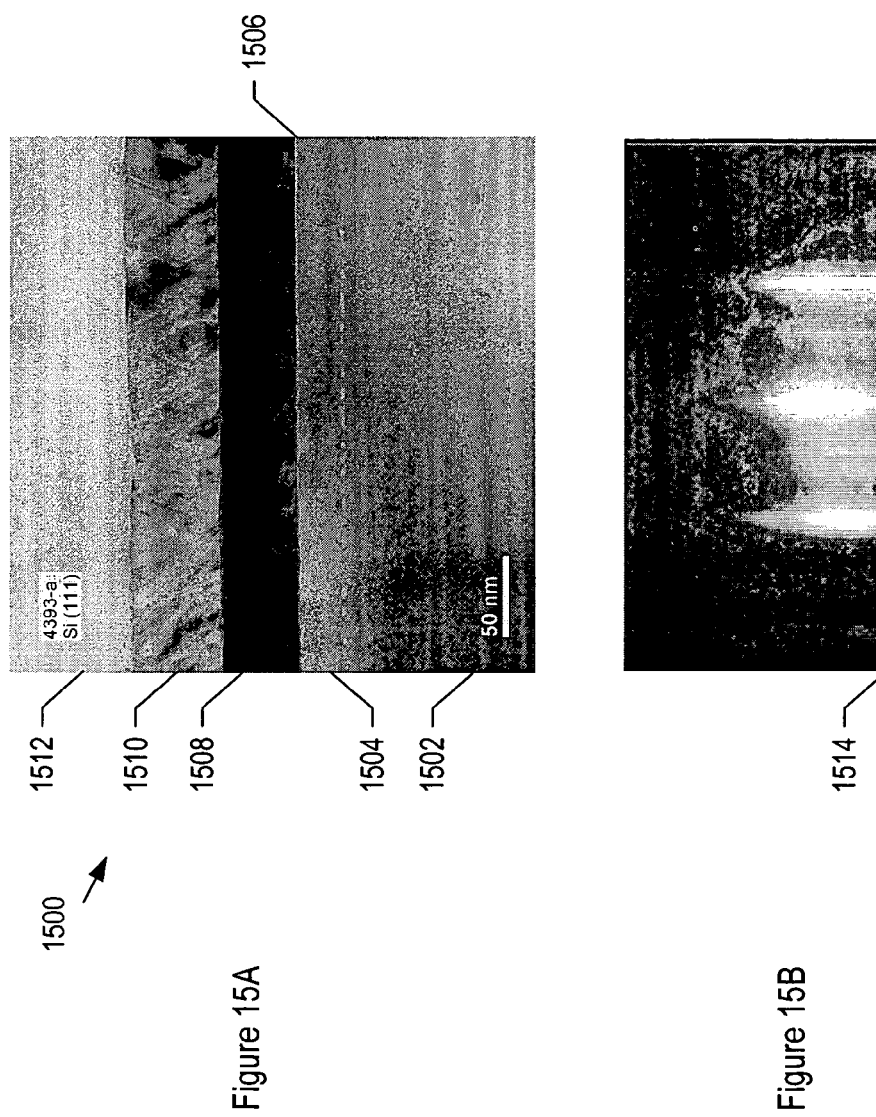
FIG. 15A depicts a TEM of SOI structure 1500. SOI structure 1500 was grown in a fashion consistent with the present invention.
FIG. 15B depicts a Reflection High-Energy Diffraction (RHEED) image taken of silicon active layer 1510.

FIG. 15A depicts a TEM of SOI structure 1500. SOI structure 1500 was grown in a fashion consistent with the present invention. SOI structure 1500 comprises silicon wafer 1502, silicon buffer layer 1504, template layer 1506, erbium oxide 1508, and silicon active layer 1510. Layer 1512 is a layer of encapsulant that provides protection during TEM sample preparation and has no significance with respect to the present invention.

Template layer 1506 is a 1 monolayer-thick layer (a layer of 1 to 10 monolayers is generally used) of erbium atoms deposited on silicon buffer.

Erbium oxide layer 1508 is a 10 nm-thick layer of $Er_2O_3$ grown using ALE. Growth conditions include a growth temperature of 400° C.-500° C. in an oxygen background pressure of $10^{-7}$ Torr, and an Er beam flux of $2\times10^{-8}$.

Silicon active layer 1510 was grown on erbium oxide layer 1508 using ALE. Growth conditions for silicon active layer 1510 were 500° C. with an oxygen background pressure of less than $10^{-9}$ Torr. The growth rate of silicon was 1 angstrom per second.

FIG. 15B depicts a Reflection High-Energy Diffraction (RHEED) image taken of silicon active layer 1510. The image demonstrates the high crystalline quality and single-phase structure of silicon active layer 1510. The length of the "streaks" in the RHEED image demonstrate that layer 1510 is atomically flat.

Comparative Result #1

Figure 16:
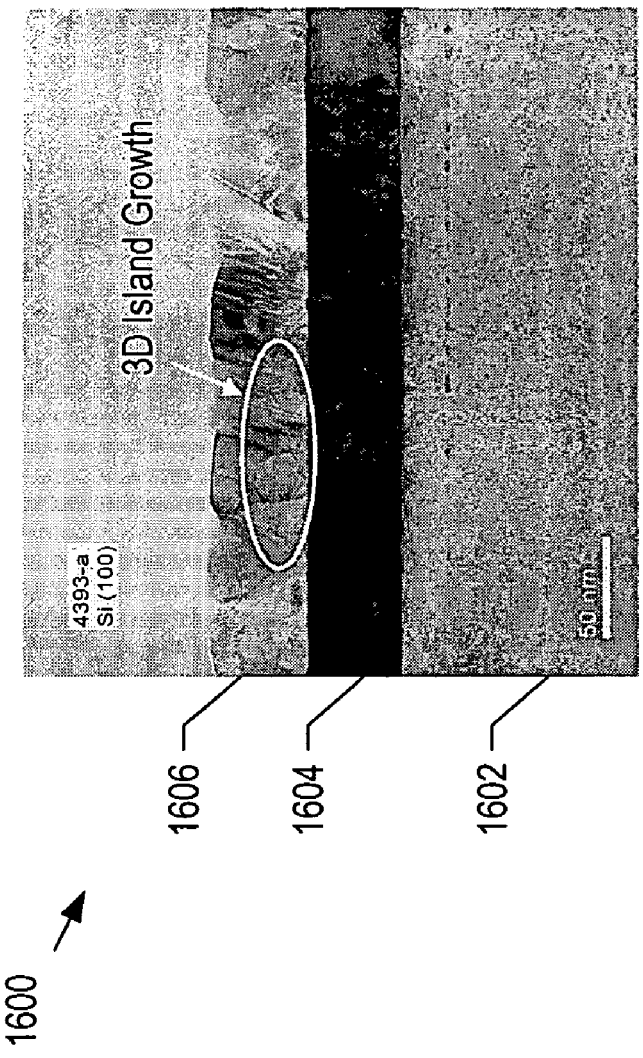
FIG. 16 depicts a portion of SOI layer structure 1600, which was grown in a fashion inconsistent with the present invention.

FIG. 16 depicts a portion of SOI layer structure 1600, which was grown in a fashion inconsistent with the present invention. SOI layer structure 1600 comprises an on-axis, <100> silicon substrate (not depicted), silicon buffer layer 1602, erbium oxide layer 1604, and silicon active layer 1606.

The use of the on-axis substrate resulted in plural phase domains, which caused 3d "island growth" of silicon active layer 1606, as depicted in FIG. 16.

Comparative Result #2

Figure 17:
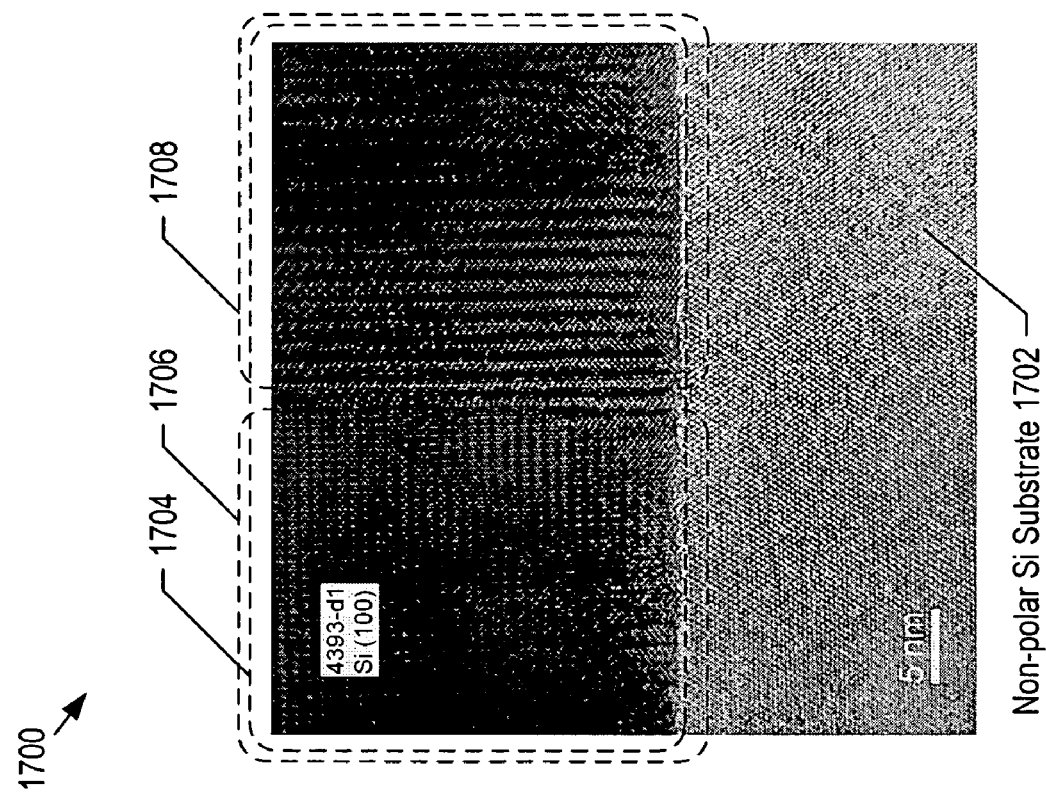
FIG. 17 depicts a TEM of layer structure 1700.

FIG. 17 depicts a TEM of layer structure 1700. Layer structure 1700 is a portion of an SOI substrate grown in a fashion inconsistent with the present invention. Layer structure 1700 comprises non-polar, on-axis, silicon substrate 1702 and single-crystal rare-earth dielectric 1704.

Non-polar, on-axis silicon substrate 1702 provides a growth surface comprising a surface that is aligned with the <001> crystal plane. As such, no preferential bonding site for either anions or cations exists on the surface of the substrate.

Single-crystal rare-earth dielectric 1704 is grown directly on the surface of silicon substrate 1702 without a template layer. As a consequence, the growth of dielectric 1704 initiates as island-type growth that leads to multiple domains of single-crystal structure (i.e., domains 1706 and 1708).

Comparative Result #3

Figure 18:
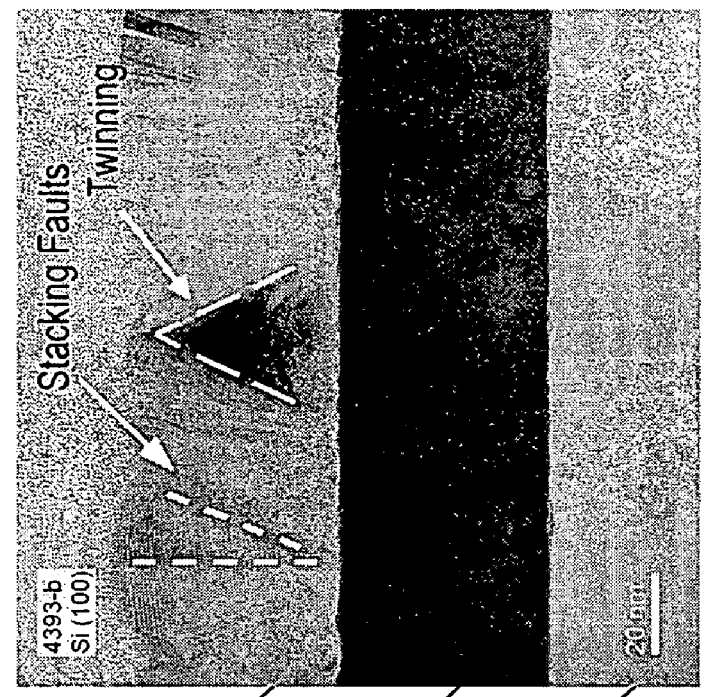
FIG. 18 depicts SOI layer structure 1800, which was grown in a fashion inconsistent with the present invention.
Figure 18:
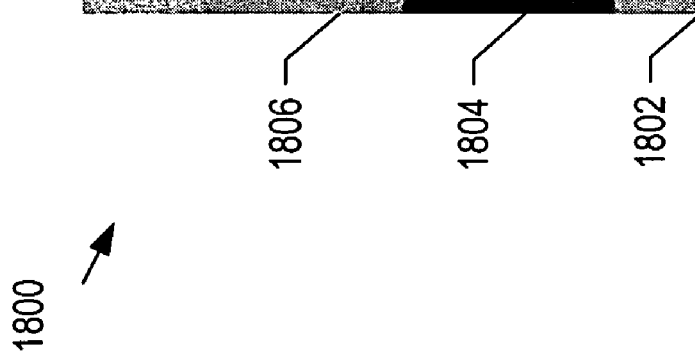

FIG. 18 depicts SOI layer structure 1800, which was grown in a fashion inconsistent with the present invention. SOI layer structure 1800 comprises an on-axis silicon substrate (not pictured), silicon buffer layer 1802, erbium oxide layer 1804, and silicon active layer 1806.

The use of an on-axis silicon substrate resulted in stacking faults and crystal twinning. The use of silicon active layer 1806 for fabrication of high-performance integrated circuit devices is therefore undesirable.

It is to be understood that the above-described embodiments are merely illustrative of the present invention and that many variations of the above-described embodiments can be devised by those skilled in the art without departing from the scope of the invention. For example, in this Specification, numerous specific details are provided in order to provide a thorough description and understanding of the illustrative embodiments of the present invention. Those skilled in the art will recognize, however, that the invention can be practiced without one or more of those details, or with other methods, materials, components, etc.

Furthermore, in some instances, well-known structures, materials, or operations are not shown or described in detail to avoid obscuring aspects of the illustrative embodiments. It is understood that the various embodiments shown in the Figures are illustrative, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present invention, but not necessarily all embodiments. Consequently, the appearances of the phrase "in one embodiment," "in an embodiment," or "in some embodiments" in various places throughout the Specification are not necessarily all referring to the same embodiment. Furthermore, the particular features, structures, materials, or characteristics can be combined in any suitable manner in one or more embodiments. It is therefore intended that such variations be included within the scope of the following claims and their equivalents.

What is claimed is:

1. A method comprising forming a first dielectric layer on a substrate, wherein said first dielectric layer comprises a rare-earth metal, and wherein said first dielectric layer is alkaline earth metal-free, wherein said rare-earth metal forms a cation having a radius less than 0.93 angstroms, and further wherein said first dielectric layer has a single-phase crystal structure.

2. The method of claim 1 wherein said first dielectric layer is formed using atomic layer epitaxy.

3. The method of claim 1 further comprising forming a template layer on said substrate prior to forming said first dielectric layer, wherein said template layer provides an energetically-favorable surface for the bonding of one of either cations or anions.

4. The method of claim 1 further comprising forming a template layer on said substrate prior to forming said first dielectric layer, wherein said template layer changes a surface of said substrate from non-polar to polar.

5. The method of claim 1 further comprising forming a template layer on said substrate prior to forming said first dielectric layer, wherein said template layer comprises an anion-rich/cation-rich superlattice structure.

6. The method of claim 1 further comprising forming a template layer on said substrate prior to forming said first dielectric layer, wherein said template layer provides a means of ordering bixbyite oxygen vacancies in said first dielectric layer.

7. The method of claim 1 further comprising providing said substrate, wherein said substrate comprises a silicon wafer, and wherein said silicon wafer has a crystal orientation selected from the group consisting of <111>, <100>, and <011>.

8. The method of claim 7 further comprising providing said silicon wafer, wherein said silicon wafer is miscut from its crystal orientation by an angle that has a value within the range of 0 to 20 degrees.

9. The method of claim 1 further comprising forming a active layer, wherein said active layer has a substantially single-phase crystal structure, and wherein said active layer comprises a material selected from the group consisting of silicon, germanium, silicon-germanium, gallium arsenide, indium phosphide, and silicon carbide.

10. The method of claim 9 wherein said active layer is formed using atomic layer epitaxy.

11. The method of claim 9 further comprising forming a wetting layer for changing a surface of said first dielectric layer from polar to non-polar.

12. The method of claim 9 further comprising forming a wetting layer for providing a surface having surface energy greater than the sum of (1) the surface energy of said active layer, and (2) the interface energy, and wherein said wetting layer supports two-dimensional, layer-by-layer growth of said active layer.

13. The method of claim 9 further comprising forming a wetting layer comprising a material selected from the group consisting of ytterbium monoxide and erbium nitride.

14. The method of claim 9 further comprising forming a second dielectric layer, wherein said second dielectric layer comprises a rare-earth metal, and wherein said second dielectric layer has a substantially single-phase crystal structure, and further wherein said active layer is interposed between said first dielectric layer and said second dielectric layer.

15. The method of claim 14 further comprising forming a template layer on said active layer prior to forming said second dielectric layer, wherein said template layer supports formation of said second dielectric layer.

16. The method of claim 1 further comprising forming said first dielectric layer with a crystal structure that is bixbyite.

17. The method of claim 1 further comprising forming said first dielectric layer with a crystal structure that is one of oxygen-rich bixbyite and oxygen-poor bixbyite.

18. The method of claim 9 further comprising a second dielectric layer comprising a rare-earth metal, wherein the crystal structure of said second dielectric layer is substantially single-phase.

19. The method of claim 18 wherein said first dielectric layer, said active layer, and second dielectric layer are formed using atomic layer epitaxy.

20. The method of claim 1 further comprising forming a rare-earth nitride layer, wherein the crystal structure of said rare-earth nitride layer is substantially single-phase.

21. The method of claim 1 wherein said substrate comprises a material selected from the group consisting of silicon, germanium, silicon-germanium, gallium arsenide, indium phosphide, and silicon carbide.

22. The method of claim 1 wherein said rare-earth metal is selected from the group consisting of erbium, ytterbium, dysprosium, holmium, thulium, and lutetium.

23. A method comprising forming a first dielectric layer on a substrate, wherein said first dielectric layer comprises a rare-earth metal, and wherein said first dielectric layer is alkaline earth metal-free, and further wherein said rare-earth metal has an atomic number greater than or equal to 66, and further wherein the crystal structure of said first dielectric layer is single-phase.

24. The method of claim 23 further comprising forming said first dielectric layer with a crystal structure that is bixbyite.

25. The method of claim 23 further comprising forming said first dielectric layer with a crystal structure that is one of oxygen-rich bixbyite and oxygen-poor bixbyite.

26. The method of claim 23 further comprising forming said first dielectric layer such that said rare-earth metal is bonded in an ionization state that is triply ionized ($3^+$).

27. The method of claim 23 further comprising forming an active layer, wherein the crystal structure of said active layer is single-phase, and wherein said active layer comprises a material selected from the group consisting of silicon, germanium, silicon-germanium, gallium arsenide, indium phosphide, and silicon carbide.

28. A method comprising forming a first dielectric layer on a substrate, wherein said first dielectric layer comprises a rare-earth metal, and wherein said first dielectric layer is alkaline earth metal-free, and wherein the crystal structure of said first dielectric layer is that of an oxygen-vacancy-derived fluorite crystal, and further wherein the crystal structure of said first dielectric layer is single-phase.

29. The method of claim 28 further comprising forming said first dielectric layer such that said first dielectric layer comprises oxygen vacancies that are aligned in the <111> crystal plane.

30. The method of claim 28 further comprising forming an active layer having a crystal structure that is single-phase, wherein said active layer comprises a material selected from the group consisting of silicon, germanium, silicon-germanium, gallium arsenide, indium phosphide, and silicon carbide.

31. A method comprising:
providing a substrate, wherein said substrate comprises a silicon wafer having crystal orientation that is selected from the group consisting of <001>, <111>, and <011>, and wherein said silicon wafer is miscut from its crystal orientation by an angle that has a value within the range of 0 to 20 degrees; and
forming a first dielectric layer, wherein said first dielectric layer comprises a dielectric comprising a rare-earth metal, and wherein said first dielectric layer is alkaline earth metal-free, and further wherein said first dielectric layer has a crystal structure that is that of an oxygen-vacancy-derived fluorite crystal.

32. The method of claim 31 further comprising forming a superlattice layer, wherein said superlattice layer is interposed between said substrate and said first dielectric layer.

33. The method of claim 31 further comprising forming an active layer having a crystal structure that is single-phase, wherein said active layer comprises a material selected from the group consisting of silicon, germanium, silicon-germanium, gallium arsenide, indium phosphide, and silicon carbide.

34. The method of claim 31 wherein said first dielectric layer and said semiconductor layer are formed using atomic layer epitaxy.

35. A method comprising:
   providing a substrate having a first surface that is non-polar;
   forming a template layer for providing a second surface that is polar, wherein said template layer is formed using an epitaxial growth method; and
   forming a first dielectric layer, wherein said first dielectric layer comprises a rare-earth metal, and wherein said first dielectric layer is alkaline earth metal free, and further wherein said first dielectric layer has a single-phase crystal structure.

36. The method of claim 35 further comprising forming a wetting layer for providing a third surface that is non-polar, wherein said wetting layer is formed using an epitaxial growth method.

37. The method of claim 35 further comprising forming an active layer having a crystal structure that is single-phase, wherein said active layer comprises a material selected from the group consisting of silicon, germanium, silicon-germanium, gallium arsenide, indium phosphide, and silicon carbide.

38. The method of claim 37 wherein said template layer, said first dielectric layer, said wetting layer, and said active layer are formed using atomic layer epitaxy.

* * * * *